United States Patent
Iida et al.

(10) Patent No.: US 11,629,288 B2
(45) Date of Patent: Apr. 18, 2023

(54) QUANTUM-DOT CONTAINING RESIN SHEET OR FILM, METHOD FOR PRODUCING THE SAME, AND WAVELENGTH CONVERSION MEMBER

(71) Applicant: NS MATERIALS Inc., Fukuoka (JP)

(72) Inventors: Kazunori Iida, Fukuoka (JP); Emi Tsutsumi, Fukuoka (JP); Mika Niwaki, Fukuoka (JP); Jun Kaneno, Fukuoka (JP); Soichiro Nikata, Fukuoka (JP); Hidetoshi Tanaka, Fukuoka (JP)

(73) Assignee: NS MATERIALS INC., Fukuoka (JP)

( * ) Notice: Subject to any disclaimer, the term of this patent is extended or adjusted under 35 U.S.C. 154(b) by 249 days.

(21) Appl. No.: 16/754,995

(22) PCT Filed: Oct. 15, 2018

(86) PCT No.: PCT/JP2018/038244
§ 371 (c)(1),
(2) Date: Apr. 9, 2020

(87) PCT Pub. No.: WO2019/078135
PCT Pub. Date: Apr. 25, 2019

(65) Prior Publication Data
US 2021/0189230 A1    Jun. 24, 2021

(30) Foreign Application Priority Data
Oct. 16, 2017    (JP) .............. JP2017-200602

(51) Int. Cl.
*B32B 27/20*    (2006.01)
*C09K 11/02*    (2006.01)
(Continued)

(52) U.S. Cl.
CPC ............ *C09K 11/02* (2013.01); *B29C 48/022* (2019.02); *B29C 48/08* (2019.02); *B29C 48/21* (2019.02);
(Continued)

(58) Field of Classification Search
CPC ....... B29C 48/022; B29C 48/08; B29C 48/21; B29K 2023/38; B29K 2033/12;
(Continued)

(56) References Cited

U.S. PATENT DOCUMENTS

| 9,631,793 B2 | 4/2017 | Hikmet et al. |
| 2012/0113671 A1 | 5/2012 | Sadasivan et al. |

(Continued)

FOREIGN PATENT DOCUMENTS

| CN | 106154364 | 11/2016 |
| CN | 108128004 | 6/2018 |

(Continued)

OTHER PUBLICATIONS

International Search Report (ISR) from International Searching Authority (Japan Patent Office) in International Pat. Appl. No. PCT/JP2018/038244, dated Dec. 25, 2018.
(Continued)

*Primary Examiner* — Lawrence D Ferguson
(74) *Attorney, Agent, or Firm* — Greenblum & Bernstein, P.L.C.

(57) ABSTRACT

To provide a quantum dot-containing resin sheet or film, a method for producing the same, and a wavelength conversion member that can, in particular, solve the problem of aggregation of the quantum dots and the problem with the use of a scattering agent, suppress a decrease in light conversion efficiency, and improve the light conversion efficiency of a resin molded product containing quantum dots. The quantum dot-containing resin sheet or film of the
(Continued)

present invention includes a stack of a plurality of resin layers, at least one of the resin layers containing quantum dots, and the plurality of resin layers is integrally molded through co-extrusion.

14 Claims, 14 Drawing Sheets

(51) Int. Cl.
| | |
|---|---|
| *B29C 48/00* | (2019.01) |
| *B29C 48/08* | (2019.01) |
| *B29C 48/21* | (2019.01) |
| *B32B 27/30* | (2006.01) |
| *B32B 27/32* | (2006.01) |
| *B32B 27/36* | (2006.01) |
| *C08J 5/18* | (2006.01) |
| *B29K 23/00* | (2006.01) |
| *B29K 33/00* | (2006.01) |
| *B29K 67/00* | (2006.01) |
| *B29K 105/16* | (2006.01) |
| *B82Y 20/00* | (2011.01) |
| *B82Y 40/00* | (2011.01) |

(52) U.S. Cl.
CPC ............ *B32B 27/20* (2013.01); *B32B 27/308* (2013.01); *B32B 27/325* (2013.01); *B32B 27/36* (2013.01); *C08J 5/18* (2013.01); *B29K 2023/38* (2013.01); *B29K 2033/12* (2013.01); *B29K 2067/003* (2013.01); *B29K 2105/162* (2013.01); *B29K 2995/0039* (2013.01); *B32B 2307/422* (2013.01); *B32B 2307/702* (2013.01); *B32B 2307/732* (2013.01); *B82Y 20/00* (2013.01); *B82Y 40/00* (2013.01); *C08J 2333/04* (2013.01); *C08J 2345/00* (2013.01); *C08J 2367/02* (2013.01)

(58) Field of Classification Search
CPC ........ B29K 2067/003; B29K 2105/162; B29K 2995/0039; B32B 2250/02; B32B 2250/03; B32B 2250/24; B32B 2264/02; B32B 2264/10; B32B 2264/202; B32B 2264/301; B32B 2264/502; B32B 2307/42; B32B 2307/422; B32B 2307/702; B32B 2307/732; B32B 2307/738; B32B 2551/00; B32B 27/08; B32B 27/18; B32B 27/20; B32B 27/30; B32B 27/308; B32B 27/325; B32B 27/36; B32B 33/00; B32B 7/023; B32B 7/027; B82Y 20/00; B82Y 30/00; B82Y 40/00; C08J 2333/04; C08J 2345/00; C08J 2367/02; C08J 5/18; C09K 11/02; C09K 11/54; G02B 5/206; H01L 2933/0041; H01L 33/504; H01L 33/505

See application file for complete search history.

(56) References Cited

U.S. PATENT DOCUMENTS

| | | |
|---|---|---|
| 2013/0169904 A1 | 7/2013 | Kang et al. |
| 2013/0334557 A1* | 12/2013 | Uchida ............... C09K 11/565 |
| | | 264/21 |
| 2015/0085490 A1 | 3/2015 | Miller et al. |
| 2017/0017022 A1 | 1/2017 | Yonemoto et al. |
| 2018/0273841 A1 | 9/2018 | Luchinger et al. |

FOREIGN PATENT DOCUMENTS

| | | |
|---|---|---|
| JP | 2013-539598 | 10/2013 |
| JP | 2017-167320 | 9/2017 |
| RU | 2581093 | 4/2016 |
| WO | 2015/147096 | 10/2015 |
| WO | 2015/152116 | 10/2015 |
| WO | 2017/108568 | 6/2017 |

OTHER PUBLICATIONS

Extended European Search Report issued by European Patent Office (EPO) in European Patent Application No. 18867724.9, dated Jun. 21, 2021.

* cited by examiner

FIG. 1
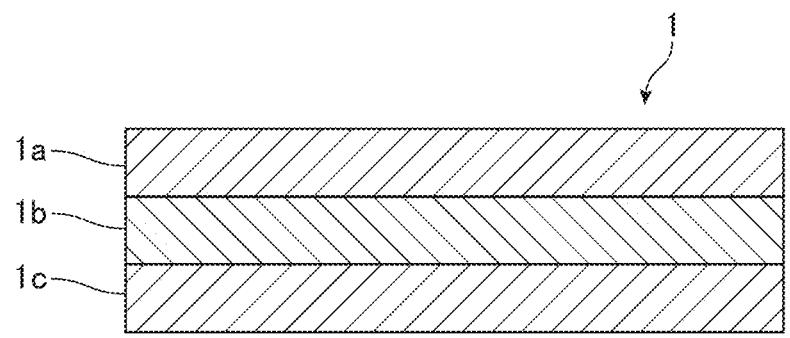
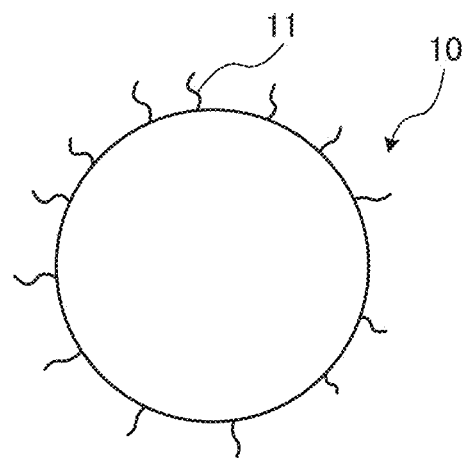
FIG. 2A
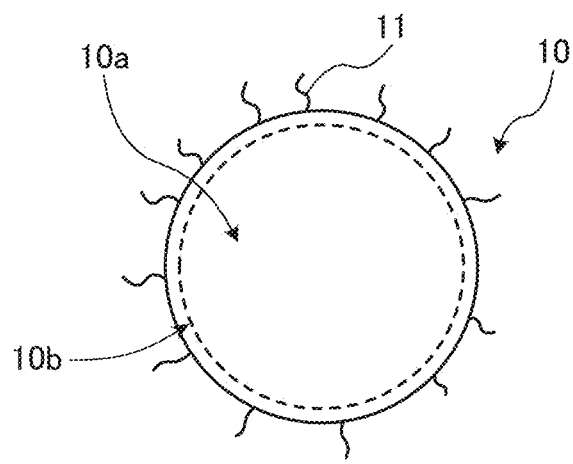
FIG. 2B

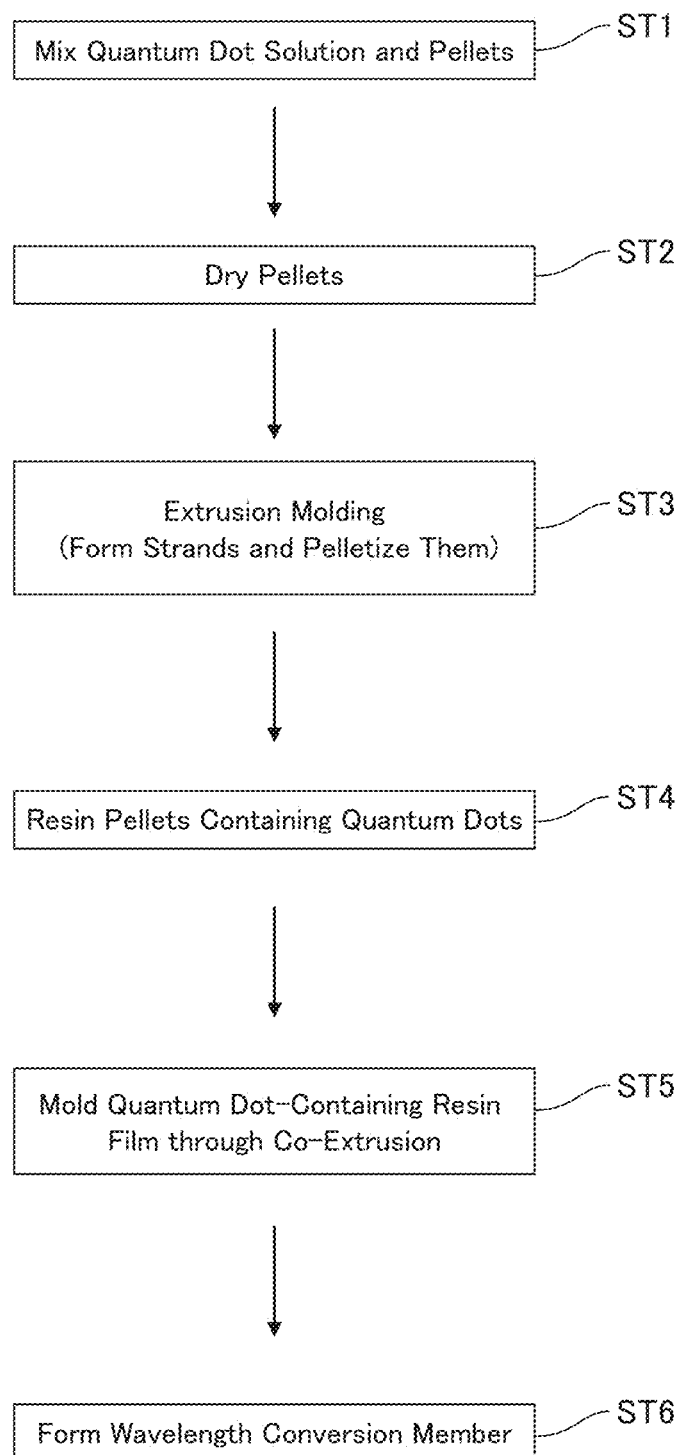

FIG. 7

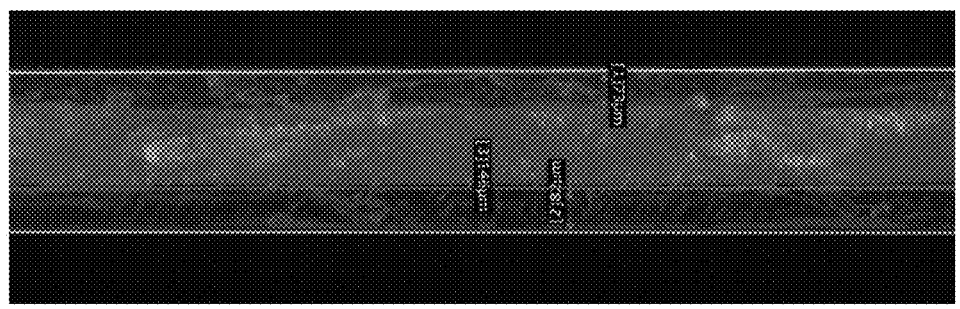

[Example 9]
(Upper Layer) PET / (Middle Layer) Acrylic Containing Cd-based G-QDs / (Lower Layer) PET

FIG. 8

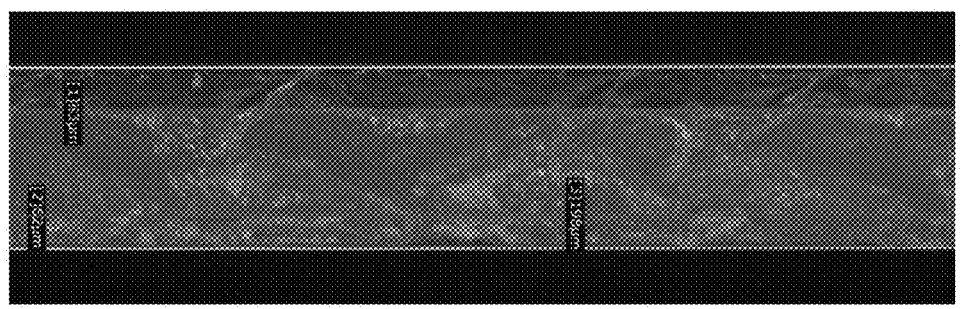

[Example 10]
(Upper Layer) PET / (Middle Layer) Acrylic Containing Cd-based R-QDs / (Lower Layer) PET

FIG. 9

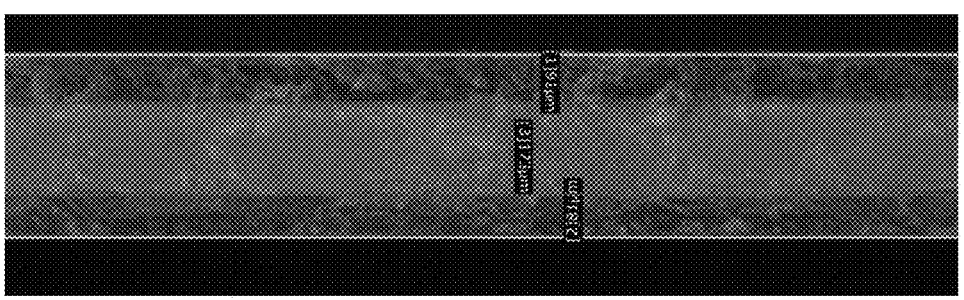

[Example 11]
(Upper Layer) PET / (Middle Layer) Acrylic Containing Cd-based G-QDs and Cd-based R-QDs / (Lower Layer) PET

FIG. 10

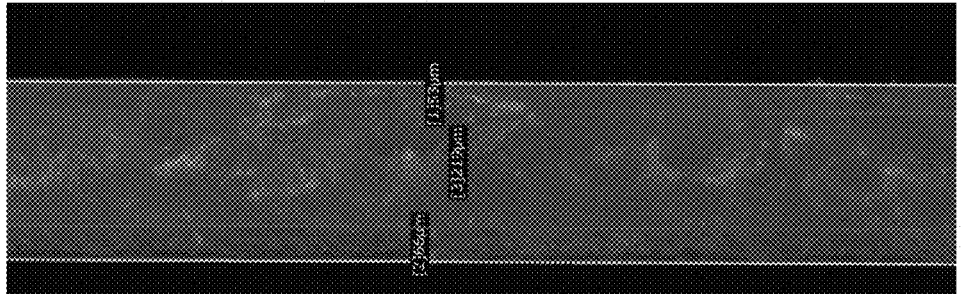

[Example 12]
(Upper Layer) Acrylic Containing Cd-based R-QDs / (Middle Layer) Acrylic Containing Cd-based G-QDs / (Lower Layer) Acrylic

[Example 13]
(Upper Layer) Acrylic / (Middle Layer) Acrylic Containing Cd-based G-QDs and Cd-based R-QDs / (Lower Layer) Acrylic

[Example 14]
(Upper Layer) COP / (Middle Layer) COP Containing Cd-based G-QDs / (Lower Layer) COP Containing R-QDs

[Example 15]
(Upper Layer) PET / (Middle Layer) COP Containing Cd-based R-QDs / (Lower Layer) PET

[Example 9]
(Upper Layer) PET / (Middle Layer) Acrylic Containing Cd-based G-QDs / (Lower Layer) PET

[Example 10]
(Upper Layer) PET / (Middle Layer) Acrylic Containing Cd-based R-QDs / (Lower Layer) PET

[Example 11]
(Upper Layer) PET / (Middle Layer) Acrylic Containing Cd-based G-QDs and Cd-based R-QDs / (Lower Layer) PET

[Example 12]
(Upper Layer) Acrylic Containing Cd-based R-QDs / (Middle Layer) Acrylic Containing Cd-based G-QDs / (Lower Layer) Acrylic

[Example 12]
(Upper Layer) Acrylic / (Middle Layer) Acrylic Containing Cd-based G-QDs / (Lower Layer) Acrylic Containing Cd-based R-QDs:
Measurement was conducted with the film of Example 12 turned upside down.

[Example 13]
(Upper Layer) Acrylic / (Middle Layer) Acrylic Containing Cd-based G-QDs and Cd-based R-QDs / (Lower Layer) Acrylic

[Example 14]
(Upper Layer) COP / (Middle Layer) COP Containing Cd-based G-QDs / (Lower Layer) COP Containing Cd-based R-QDs

[Example 14]
(Upper Layer) COP Containing Cd-based R-QDs / (Middle Layer) COP Containing Cd-based G-QDs / (Lower Layer) COP:
Measurement was conducted with the film of Example 14 turned upside down.

[Example 15]
(Upper Layer) PET / (Middle Layer) COP Containing Cd-based R-QDs / (Lower Layer) PET

[Example 16]
(Upper Layer) COP Containing Cd-based R-QDs / (Middle Layer) COP Containing Cd-based G-QDs and Cd-based R-QDs / (Lower Layer) COP Containing Cd-based G-QDs

[Example 17]
(Upper Layer) PET Containing Cd-based R-QDs / (Middle Layer) Acrylic Containing Cd-based G-QDs / (Lower Layer) PET

[Example 18]
(Upper Layer) Acrylic Containing Cd-free R-QDs / (Middle Layer) Acrylic Containing Cd-free G-QDs / (Lower Layer) PET

[Example 19]
(Upper Layer) Acrylic Containing Cd-free R-QDs / (Middle Layer) Acrylic Containing Cd-based G-QDs / (Lower Layer) Acrylic

[Example 12]
(Upper Layer) Acrylic / (Middle Layer) Acrylic Containing G-QDs / (Lower Layer) Acrylic Containing R-QDs

[Example 12]
(Upper Layer) Acrylic Containing R-QDs / (Middle Layer) Acrylic Containing G-QDs / (Lower Layer) Acrylic:
Measurement was conducted with the film of Example 12 turned upside down.

[Example 14]
(Upper Layer) COP / (Middle Layer) COP Containing G-QDs / (Lower Layer) COP Containing R-QDs

[Example 14]
(Upper Layer) COP Containing R-QDs / (Middle Layer) COP Containing G-QDs / (Lower Layer) COP:
Measurement was conducted with the film of Example 14 turned upside down.

QUANTUM-DOT CONTAINING RESIN SHEET OR FILM, METHOD FOR PRODUCING THE SAME, AND WAVELENGTH CONVERSION MEMBER

TECHNICAL FIELD

The present invention relates to a quantum dot-containing resin sheet or film, a method for producing the same, and a wavelength conversion member.

BACKGROUND ART

A quantum dot is a nanoparticle containing about several hundreds to several thousands of atoms and having a particle size on the order of several nm to several tens of nm. Quantum dots are also referred to as fluorescent nanoparticles, semiconductor nanoparticles, or nanocrystals.

The peak light emission wavelength of a quantum dot can be controlled in various ranges depending on the particle size and composition of the nanoparticle, and thus can be adjusted to the intended wavelength. Quantum dots can be dispersed in resin and used as wavelength conversion materials. For example, Patent Literature 1 discloses a film obtained by dispersing quantum dots in resin.

CITATION LIST

Patent Literature

Patent Literature 1: JP 2017-167320 A

SUMMARY OF INVENTION

Technical Problem

However, since the film disclosed in Patent Literature 1 includes films bonded together, complex work is needed and light conversion efficiency is likely to decrease, which are problematic.

The present invention has been made in view of the foregoing. It is an object of the present invention to provide a quantum dot-containing resin sheet or film, a method for producing the same, and a wavelength conversion member that can, in particular, improve the light conversion efficiency of a resin molded product containing quantum dots.

Solution to Problem

A quantum dot-containing resin sheet or film according to the present invention includes a stack of a plurality of resin layers, at least one of the resin layers containing quantum dots, and the plurality of resin layers is integrally molded through co-extrusion.

In the present invention, the resin layer containing the quantum dots and the resin layer not containing the quantum dots are preferably integrally molded.

In the present invention, the resin layer not containing the quantum dots preferably contains a functional additive.

In the present invention, two or more types of quantum dots with different fluorescence wavelengths are preferably contained in different resin layers among the plurality of resin layers.

In the present invention, the quantum dots preferably include at least green-light emitting quantum dots and red-light emitting quantum dots.

In the present invention, the quantum dot-containing resin sheet or film includes a first resin layer containing the green-light emitting quantum dots and not containing the red-light emitting quantum dots, a second resin layer containing the red-light emitting quantum dots and not containing the green-light emitting quantum dots, and a middle resin layer located between the first resin layer and the second resin layer and containing both the red-light emitting quantum dots and the green-light emitting quantum dots, in which the green-light emitting quantum dots and the red-light emitting quantum dots each have a concentration gradient in a region from the first resin layer to the second resin layer.

In the present invention, the resin layer containing the red-light emitting quantum dots is preferably arranged on the side of excitation light, and the resin layer containing the green-light emitting quantum dots is preferably arranged on the side remote from the excitation light.

In the present invention, the resin layer preferably contains amorphous resin.

A quantum dot-containing resin sheet or film according to the present invention includes resin layers containing quantum dots, the quantum dots being unevenly distributed in the thickness direction of the resin layers.

A quantum dot-containing resin sheet or film according to the present invention includes resin layers containing two or more types of quantum dots with different fluorescence wavelengths, each of the two or more types of quantum dots having a different concentration gradient in the thickness direction of the resin layers.

In the present invention, the concentration of the quantum dots in the entire resin layers is preferably greater than or equal to 0.05% and less than or equal to 1.5%.

In the present invention, the total thickness of the resin layers is preferably greater than or equal to 50 µm and less than or equal to 500 µm.

In the present invention, each of the ratio of the green light intensity to the blue light intensity and the ratio of the red light intensity to the blue light intensity is preferably greater than or equal to 0.3.

In the present invention, the full width at half maximum of fluorescence of each of the blue light intensity, the green light intensity, and the red light intensity is preferably less than or equal to 100 nm.

A wavelength conversion member according to the present invention is formed from one of the aforementioned quantum dot-containing resin sheets or films.

A method for producing a quantum dot-containing resin sheet or film according to the present invention includes forming resin pellets containing quantum dots, and integrally molding two or more resin layers through co-extrusion.

Advantageous Effects of Invention

The quantum dot-containing resin sheet or film of the present invention is integrally molded through co-extrusion, whereby complex production steps are not needed and light conversion efficiency can be improved.

In addition, using the quantum dot-containing resin sheet or film of the present invention can produce a high-efficiency wavelength conversion member containing quantum dots.

Further, according to the method for producing a quantum dot-containing resin sheet or film of the present invention, the resin sheet or film can be produced without the need for complex bonding steps.

BRIEF DESCRIPTION OF DRAWINGS

FIG. 1 is a cross-sectional view of a quantum dot-containing resin sheet or film according to a first embodiment.

FIG. 2A is a schematic view of a quantum dot according to the present embodiment.

FIG. 2B is a schematic view of a quantum dot according to the present embodiment.

FIG. 6 is a flowchart illustrating the steps of producing the quantum dot-containing resin sheet or film according to the present embodiment.

FIG. 7 is an enlarged photograph of a cross-sectional view of a quantum dot-containing resin film according to Example 9.

FIG. 8 is an enlarged photograph of a cross-sectional view of a quantum dot-containing resin film according to Example 10.

FIG. 9 is an enlarged photograph of a cross-sectional view of a quantum dot-containing resin film according to Example 11.

FIG. 10 is an enlarged photograph of a cross-sectional view of a quantum dot-containing resin film according to Example 12.

DESCRIPTION OF EMBODIMENTS

Figure 3:
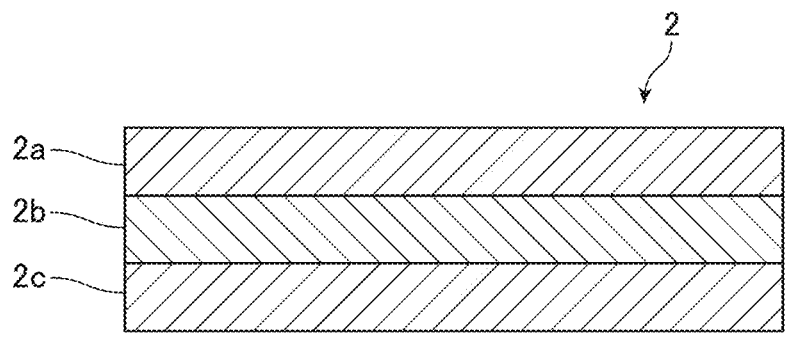
FIG. 3 is a cross-sectional view of a quantum dot-containing resin sheet or film according to a second embodiment.

Hereinafter, embodiments of the present invention (hereinafter abbreviated to "embodiments") will be described in detail. It should be noted that the present invention is not limited to the following embodiments and can be implemented in various ways within the spirit and scope of the present invention.

FIG. 1 is a cross-sectional view of a quantum dot-containing resin film according to a first embodiment. A "film" as referred to herein is defined as a flexible sheet object. Meanwhile, a "sheet" as referred to herein is typically defined as the one having a thickness that is smaller than its length and width. In particular, the dimensions, such as the length L, width W, and thickness T, of a quantum dot-containing resin film or sheet are not limited and are changed in various ways depending on the final product to be obtained. For example, such a resin film or sheet may be used for a backlight of a large product, such as a television, or a backlight of a small portable device, such as a smartphone. Therefore, the dimensions of the resin film or sheet are determined according to the final product to be obtained.

Although a quantum dot-containing resin film will be described hereinafter, the term may be used interchangeably with a quantum dot-containing resin sheet.

As illustrated in FIG. 1, a quantum dot-containing resin film 1 has a three-layer film structure, for example. A middle layer 1b illustrated in FIG. 1 is a layer containing quantum dots (QD). The quantum dots will be described below.

A quantum dot has fluorescence properties due to its band-edge luminescence, and exhibits the quantum size effect because of its particle size.

A quantum dot refers to a nanoparticle with a size of about several nm to several tens of nm. For example, a quantum dot contains CdS, CdSe, ZnS, ZnSe, ZnSeS, ZnTe, ZnTeS, InP, $AgInS_2$, or $CuInS_2$, or has a structure obtained by covering such a quantum dot as a core with a shell. The use of Cd is restricted because of its toxicity in some countries. Thus, quantum dots preferably do not contain Cd.

As illustrated in FIG. 2A, a quantum dot 10 preferably has a large number of organic ligands 11 coordinated to its surface. Accordingly, aggregation of quantum dots 10 can be suppressed and intended optical properties can be exhibited.

Although ligands that can be used for reactions are not particularly limited, representative examples of ligands are as follows.

Primary aliphatic amines, such as oleylamine: $C_{18}H_{35}NH_2$, stearylamine (octadecylamine): $C_{18}H_{37}NH_2$, dodecylamine (laurylamine): $C_{12}H_{25}NH_2$, decylamine: $C_{10}H_{21}NH_2$, and octylamine: $C_8H_{17}NH_2$;

fatty acids, such as oleic acid: $C_{17}H_{33}COOH$, stearic acid: $C_{17}H_{35}COOH$, palmitic acid: $C_{15}H_{31}COOH$, myristic acid: $C_{13}H_{27}COOH$, lauric acid (dodecanoic acid): $C_{11}H_{23}COOH$, decanoic acid: $C_9H_{19}COOH$, and octanoic acid: $C_7H_{15}COOH$;

thiols, such as 1-octadecanethiol: $C_{18}H_{37}SH$, 1-hexadecanethiol: $C_{16}H_{33}SH$, 1-tetradecanethiol: $C_{14}H_{29}SH$, 1-dodecanethiol: $C_{12}H_{25}SH$, 1-decanethiol: $C_{10}H_{21}SH$, and 1-octanethiol: $C_8H_{17}SH$;

phosphines, such as tri-n-octylphosphine: $(C_8H_{17})_3P$, triphenylphosphine: $(C_6H_5)_3P$, and tributylphosphine: $(C_4H_9)_3P$; and phosphine oxides, such as trioctylphosphine oxide: $(C_8H_{17})_3P=O$, triphenylphosphine oxide: $(C_6H_5)_3P=O$, and tributylphosphine oxide: $(C_4H_9)_3P=O$.

The quantum dot 10 illustrated in FIG. 2B is a core-shell structure including a core 10a and a shell 10b covering the surface of the core 10a. As illustrated in FIG. 2B, the surface of the quantum dot 10 preferably has a large number of organic ligands 11 coordinated thereto. The core 10a of the quantum dot 10 illustrated in FIG. 2B is the nanoparticle illustrated in FIG. 2A. Therefore, the core 10a is formed of the aforementioned material, for example. For example, the core 10a is formed of zinc sulfide (ZnS), though it does not question the material of the shell 10b. The shell 10b preferably does not contain cadmium (Cd) like the core 10a.

The shell 10b may be in the state of a solid solution supported on the surface of the core 10a. In FIG. 2B, the boundary between the core 10a and the shell 10b is indicated by the dotted line. This means that the boundary between the core 10a and the shell 10b may be or may not be confirmed through analysis.

The middle layer 1b may contain not only a single type of quantum dots 10 but also two or more types of quantum dots with different fluorescence wavelengths as appropriate.

The middle layer 1b is formed of a resin composition containing the quantum dots 10 dispersed therein. Each of the upper layer 1a, the middle layer 1b, and the lower layer 1c is a resin layer that preferably contains amorphous resin. Amorphous resin used herein is not particularly limited, but resin with a high degree of transparency is used. Typically, resin with a total light transmittance of greater than or equal to 85% is preferably used, though the resin used herein is not particularly limited thereto. As amorphous resin, resin that can be melt-extruded, such as cyclic olefin polymer (COP), cyclic olefin copolymer (COC), poly(styrene) (PS), acrylic resin, poly(carbonate) (PC), modified-poly(phenyleneether) (PPE), poly(ethylene terephthalate) (PET), ethylene vinyl alcohol (EVAL), or polymethylpentene (PMP) can be used. As semi-crystalline resin with a high degree of transparency, resin that can be melt-extruded, such as polyethylene (PE), polypropylene (PP), or poly(vinylidene fluoride) (PVDF) can be used.

In addition, a combination of amorphous resin used in the present embodiment is not particularly limited as it is selected according to the physical properties and functions required of the member to be produced.

The amorphous resin in which quantum dots are to be dispersed for forming a resin molded product is preferably acrylic resin, homopolymers (COP) or copolymers (COC) of cyclic olefin resin, or poly(ethylene terephthalate) (PET) in light of the dispersibility of the quantum dots in the resin and the fluorescence intensity after the dispersion, or poly(carbonate) (PC) in light of the heat resistance.

Each of the upper layer 1a and the lower layer 1c illustrated in FIG. 1 is a resin layer not containing the quantum dots 10, and serves as a protective layer for the middle layer 1b. Each of the upper layer 1a and the lower layer 1c is formed of the aforementioned resin material or the like. For example, each of the upper layer 1a and the lower layer 1c is formed using acrylic resin, as an outer layer of the middle layer 1b, thereby being able to protect the middle layer 1b from damage. Alternatively, each of the upper layer 1a and the lower layer 1c is formed using poly(ethylene terephthalate) resin (PET) or ethylene vinyl alcohol (EVAL), for example, as an outer layer of the middle layer 1b, thereby functioning as a barrier layer against water and oxygen. As a further alternative, each of the upper layer 1a and the lower layer 1c is formed using PET, poly(carbonate) (PC), cyclic olefin polymer (COP), or cyclic olefin copolymer (COC), for example, as an outer layer of the middle layer 1b, thereby being able to make the resulting film less brittle and improve the handling of the film.

In addition, the outer layers (i.e., the upper layer 1a and the lower layer 1c) formed above and below the middle layer 1b containing the quantum dots 10 are also used to flatten the resulting film and adjust the total film thickness.

It should be noted that each of the upper layer 1a and the lower layer 1c need not be formed to the same thickness, or need not be formed of the same resin material. The upper layer 1a and the lower layer 1c may have functionally asymmetrical structures.

Further, one or both of the upper layer 1a and the lower layer 1c may contain a fluorescent material, such as a fluorescent pigment or fluorescence dye, other than quantum dots.

The quantum dot-containing resin film 1 illustrated in FIG. 1 includes a resin layer (i.e., the middle layer 1b) containing the quantum dots 10 and resin layers (i.e., the upper layer 1a and the lower layer 1c) not containing the quantum dots 10, all of which have been integrally molded through co-extrusion. That is, there is no bonding layer at the interface between the middle layer 1b and the upper layer 1a or at the interface between the middle layer 1b and the lower layer 1c, and the resin layers are directly joined together. Thus, the thickness of the quantum dot-containing resin film 1 can be appropriately reduced and light conversion efficiency can be increased.

In FIG. 1, a quantum dot-containing resin layer can also be used for the upper layer 1a or the lower layer 1c. This will allow quantum dots to be unevenly distributed in the thickness direction of the film.

A quantum dot-containing resin film 2 of a second embodiment illustrated in FIG. 3 has a three-layer film structure that includes a middle layer 2b containing the quantum dots 10, and an upper layer 2a and a lower layer 2c formed above and below the middle layer 2b and not containing the quantum dots 10.

Each of the upper layer 2a and the lower layer 2c of the quantum dot-containing resin film 2 contains one or more types of additives. Examples of additives include, but are not limited to, a light scattering agent, such as silica ($SiO_2$) or zinc oxide (ZnO): a lubricant, such as talc or metal soap; an anti-blocking agent; and a reinforcing agent, such as glass fibers or beads. With such additives, various functions can be provided. In addition, each of the upper layer 2a and the lower layer 2c may contain a fluorescent material, such as a fluorescent pigment or fluorescence dye, other than quantum dots. It should be noted that the upper layer 2a and the lower layer 2c need not necessarily contain the same additive.

Figure 4:
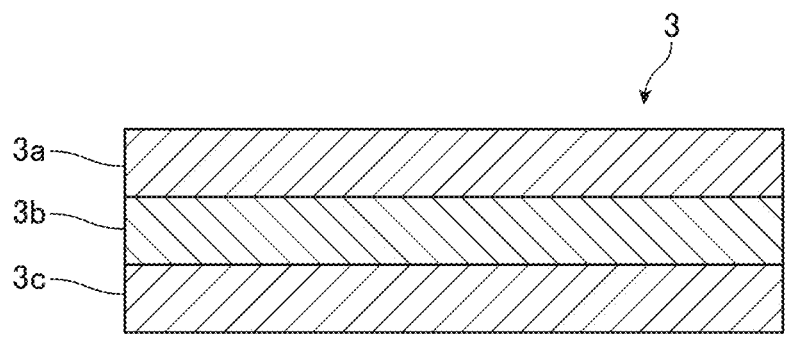
FIG. 4 is a cross-sectional view of a quantum dot-containing resin sheet or film according to a third embodiment.

In a quantum dot-containing resin film 3 of a third embodiment illustrated in FIG. 4, each of an upper layer 3a and a middle layer 3b contains quantum dots. A lower layer 3c is a resin layer not containing quantum dots. The upper layer 3a and the middle layer 3b may contain different types of quantum dots. It should be noted that the lower layer 3c may contain a fluorescent material, such as a fluorescent pigment or fluorescence dye, other than quantum dots.

For example, the upper layer 3a may contain red-light emitting quantum dots and the middle layer 3b may contain green-light emitting quantum dots, and vice versa, the middle layer 3b may contain red-light emitting quantum dots and the upper layer 3a may contain green-light emitting quantum dots.

For example, when the quantum dot-containing resin film 3 is used as a wavelength conversion member, it is preferable to arrange a layer containing red-light emitting quantum dots on the side of excitation light and allow a layer on the side remote from the excitation light to contain green-light emitting quantum dots so as to avoid absorption of fluorescence of the green-light emitting quantum dots by the red-light emitting quantum dots.

That is, when quantum dots are used as wavelength conversion materials, two or more types of quantum dots with different fluorescence wavelengths are used. For example, for a wavelength conversion member used for a display, a method is used that converts blue LED light, used as excitation light of a backlight, with two types of quantum dots including green-light emitting quantum dots and red-light emitting quantum dots.

Herein, the red-light emitting quantum dots can absorb not only the excitation light but also fluorescence of the green-light emitting quantum dots. Thus, the intensity of green fluorescence would decrease.

To compensate for the decrease in the intensity of green light-emission, that is, to maintain the efficiency of conversion of light into green light high, a higher concentration of quantum dots should be used. In such a case, however, aggregation of the particles is likely to occur and self-absorption of the green quantum dots would also occur. Thus, the higher the concentration, the lower the light conversion efficiency of the quantum dots, which is problematic.

Meanwhile, a method of maintaining the concentration of quantum dots low using a light scattering agent in combination is typically adopted. However, with such a method, all portions of the light will scatter, and not only will the scattering effect increase but also green light will be absorbed by the red-light emitting quantum dots and thus be converted into red light, which in turn can adversely affect chromaticity. Therefore, the use of a scattering agent is insufficient even though it can increase light conversion efficiency.

In response, in the present embodiment, the upper layer 3a contains red-light emitting quantum dots, and the middle layer 3b contains green-light emitting quantum dots. Therefore, the concentration of quantum dots in each layer can be suppressed low. Herein, arranging a layer containing red-light emitting quantum dots on the side of excitation light and allowing a layer on the side remote from the excitation light to contain green-light emitting quantum dots can avoid absorption of fluorescence of the green-light emitting quantum dots by the red-light emitting quantum dots and thus can improve light conversion efficiency.

The lower layer 3c illustrated in FIG. 4 may contain functional additives as with the upper layer 2a and the lower layer 2c in FIG. 3. In addition, the quantum dot-containing resin film 3 in FIG. 4 may be formed in two layers including the upper layer 3a and the middle layer 3b, and the lower layer 3c may be omitted.

Alternatively, the upper layer 3a and the lower layer 3c illustrated in FIG. 4 may contain quantum dots, and the middle layer 3b may be formed as a resin layer not containing quantum dots. Herein, the middle layer 3b may contain a fluorescent material, such as a fluorescent pigment or fluorescence dye, other than quantum dots.

It should be noted that the light transmittance and refractive index of the layer not containing quantum dots are preferably selected appropriately taking into consideration reflection and refraction of light to occur at the interface between the layers, for example.

Figure 5:
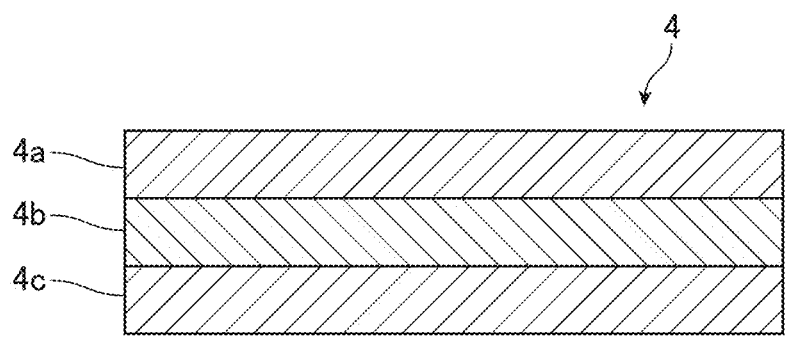
FIG. 5 is a cross-sectional view of a quantum dot-containing resin sheet or film according to a fourth embodiment.

A quantum dot-containing resin film 4 of a fourth embodiment illustrated in FIG. 5 is formed in a stacked-layer film structure that includes an upper layer 4a as a resin layer containing first quantum dots, a lower layer 4c as a resin layer containing second quantum dots, and a middle layer 4b located between the upper layer 4a and the lower layer 4c and containing both the first quantum dots and the second quantum dots. For example, the first quantum dots are green-light emitting quantum dots, and the second quantum dots are red-light emitting quantum dots. Therefore, the middle layer 4b contains both the green-light emitting quantum dots and the red-light emitting quantum dots.

The green-light emitting quantum dots are not contained in the lower layer 4c and are contained in both the middle layer 4b and the upper layer 4a. The upper layer 4a contains more green-light emitting quantum dots than does the middle layer 4b. Therefore, the green-light emitting quantum dots have a concentration gradient such that the concentration increases in a region from the lower layer 4c to the upper layer 4a.

Meanwhile, the red-light emitting quantum dots are not contained in the upper layer 4a and are contained in both the middle layer 4b and the lower layer 4c. The lower layer 4c contains more red-light emitting quantum dots than does the middle layer 4b. Therefore, the red-light emitting quantum dots have a concentration gradient such that the concentration increases in a region from the upper layer 4a to the lower layer 4c.

Although two types of quantum dots are used in FIG. 5, one type of quantum dots may be contained at different concentrations in the respective resin layers so that the one type of quantum dots have a concentration gradient.

Although each of the embodiments illustrated in FIG. 1 and FIG. 3 to FIG. 5 concerns a three-layer film structure, the number of layers is not limited thereto. It is acceptable as long as two or more types of resin layers are used as the layers.

It is important that a resin molded product to be produced be a stack of two layers or three or more layers, and quantum dots be dispersed in the respective resin layers. Applying such a structure can suppress self-absorption of the quantum dots, suppress absorption of fluorescence of a given type of quantum dots by another type of quantum dots with a different light emission wavelength, protect against oxygen and moisture, increase light conversion efficiency, and exhibit functions such as light scattering. The necessary function can be controlled by adjusting the thickness of each layer and a combination of the layers. As the necessary function differs depending on the intended use of the final product, the layer structure of the multilayer film of the present embodiment is not strictly limited.

In the present embodiment, the concentration of the quantum dots in the entire resin layers is preferably greater than or equal to 0.05% and less than or equal to 1.5%. In this manner, since the content of the quantum dots can be reduced in the present embodiment, the problem of the aggregation of the quantum dots can be fundamentally avoided.

In the present embodiment, the total thickness of the resin layers is preferably greater than or equal to 50 µm and less than or equal to 500 µm. In the present embodiment, the resin layers can be integrally molded without the need for bonding layers. Thus, the thickness can be reduced.

In the present embodiment, each of the ratio of the green light intensity to the blue light intensity and the ratio of the red light intensity to the blue light intensity can be set to greater than or equal to 0.3. In particular, forming a resin layer containing red-light emitting quantum dots on the side of excitation light and allowing a resin layer on the side remote from the excitation light to contain green-light emitting quantum dots can avoid absorption of fluorescence of the green-light emitting quantum dots by the red-light emitting quantum dots and thus can properly obtain the aforementioned intensity ratio.

In the present embodiment, the full width at half maximum of fluorescence of each of blue light intensity, green light intensity, and red light intensity can be set to less than or equal to 100 nm.

Next, a method for producing a quantum dot-containing resin film and a wavelength conversion member of the present embodiment will be described. First, as illustrated in FIG. 6, a quantum dot solution and resin pellets are mixed and dried (steps ST1 and ST2). Accordingly, resin pellets with surfaces coated with the quantum dots are obtained.

Next, the resin pellets are kneaded with a twin-screw extruder, for example, and the obtained strands are cut with a pelletizer so that resin pellets containing the quantum dots dispersed therein are obtained (steps ST3 and ST4).

Next, two or more types of resin pellets are loaded into different raw-material feeding ports of a molding machine. Then, while the pellets are melted with a co-extruder, they are extruded through T-dies so that a quantum dot-containing resin film with a stacked layer structure is obtained (step ST5).

Then, the quantum dot-containing resin film is formed into a desired wavelength conversion member (step ST6).

In the present embodiment, two or more types of resin layers that are separated can be molded using typical resin molding, such as co-extrusion. Therefore, a wide film can be formed by changing the size of the T-dies. Further, since the arrangement of the resin layers can be freely changed, highly flexible design of a functional multilayer film is possible.

In the present embodiment, an optical adhesive is not used unlike with a stacked-layer film obtained through bonding. Therefore, a decrease in light transmittance, which would otherwise occur due to the presence of a bonding layer, can be suppressed, for example. Further, an unwanted increase in thickness can also be suppressed.

A quantum dot-containing film formed with the production method of the present embodiment can suppress a decrease in conversion efficiency, which would otherwise occur due to self-absorption of the quantum dots, and thus can increase luminous efficacy.

In the present embodiment, two or more types of quantum dots are individually dispersed in two or more types of resin layers, respectively, and the stacking order of the resin layers can be freely designed. For example, when a film to be formed is used as a wavelength conversion member, it is preferable to arrange a layer containing red-light emitting quantum dots on the side of excitation light and arrange a layer containing green-light emitting quantum dots above the layer containing the red-light emitting quantum dots so as to avoid absorption of fluorescence of the green-light emitting quantum dots by the red-light emitting quantum dots.

In the present embodiment, in addition to the quantum dot-containing resin layers, a layer with a light diffusion function, an outer layer serving as a film protection, and the like can be appropriately arranged. A resin layer(s) not containing quantum dots can contain a fluorescent material, such as a fluorescent pigment or fluorescence dye, other than quantum dots.

Although resin that can be used in the present embodiment are basically transparent resin with different refractive indices, it is also possible to use the same material for each layer. As there are many combinations of such types of resin, many choices are advantageously available for designing a product according to its intended use.

As the quantum dots are mechanically kneaded into resin with an extruder in the present embodiment, pretreatment for dispersing the quantum dots is not necessary. Thus, the compositions and shapes of the quantum dots to be used as well as the shell structures thereof are not particularly limited. For example. Cd-based quantum dots, which contain Cd, or Cd-free quantum dots, which contain no Cd, can be used.

As the resin layers used in the present embodiment contain amorphous transparent resin with different refractive indices, light is reflected at the interface between the resin layers. Controlling the difference in refractive index between the two types of resin at the interface between the resin layers can suppress leakage of light, which results from wavelength conversion by the quantum dots, and thus can efficiently extract the light.

In the present embodiment, not only can the number of quantum dot-containing resin layers be increased, but also the necessary functions can be added, and various additives can be used as described with reference to FIG. 3. Exemplary representative additives include, but are not limited to, a light scattering agent, stabilizer, antioxidant, lubricant, anti-blocking agent, and plasticizer.

In the present embodiment, an organic or inorganic light scattering agent can be used, for example. In such a case, the light scattering agent can be directly kneaded in powder form into resin pellets during extrusion molding, but in order to disperse the light scattering agent in only a specific phase, a light diffusion layer can also be formed using resin into which the light scattering agent has been kneaded in advance as a raw material.

In addition, when the outermost layer is arranged other than the resin layer(s) in which quantum dots are dispersed, for protection against oxygen and water, for example, resin, such as poly(ethylene terephthalate) (PET), poly(vinyl alcohol) (PVA), or poly(ethylene vinyl alcohol) (EVAL), that has relatively low permeability to oxygen and water is desirably used.

As described above, in the present embodiment, transparent resin containing quantum dots can be molded into any given size or shape. Since the molding method used herein is co-extrusion that is based on the conventional extrusion molding, continuous production is possible and multilayer films with optical functions can be produced more inexpensively than with a production method that involves a film bonding step.

The amorphous resin in which quantum dots are to be dispersed for forming a multilayer film desirably have a large difference in refractive index. Therefore, a combination of resin with a low refractive index and resin with a high refractive index is preferably used. Representative preferable examples include a combination of acrylic resin and cyclic olefin polymer and a combination of acrylic resin and poly(ethylene terephthalate) resin. Accordingly, light conversion efficiency can be increased without using a scattering agent due to reflection or refraction of light that occurs at the interface between the resin layers.

In the present embodiment, the resin molded product includes two layers or three or more layers of transparent resin, but since the layer structure is obtained through a single-step production, that is, co-extrusion, the resin molded product basically has an integrated structure having no peeling at its end faces or cut faces. Such a layer structure can be confirmed with an optical instrument, such as a microscope.

EXAMPLES

Hereinafter, the advantageous effects of the present invention will be described by way of examples of the present invention. It should be noted that the embodiments of the present invention are not limited by the following examples by any means.

[Materials]

In the present experiment, the following materials were used to produce a resin molded product. It should be noted that each raw material was dried in a vacuum drying oven under the conditions of a reduced pressure and a temperature greater than or equal to 80° C. for 1 day or more before use.

Resin: cyclic olefin polymer (COP): ZEONOR (registered trademark) 1060R manufactured by Zeon Corporation.

Acrylic resin (PMMA): Optimas (registered trademark) 7500FS manufactured by MITSUBISHI GAS CHEMICAL COMPANY, INC.

Polyester resin (PET): ALTESTER (registered trademark) 4203F manufactured by MITSUBISHI GAS CHEMICAL COMPANY, INC.

Additives: stearic acid zinc (ZnSt) manufactured by Sigma-Aldrich

For the experiments, the following materials were used as the quantum dots (QDs). It should be noted that each type of the quantum dots (QDs) was used while being dispersed in a hexane ($C_6H_{12}$) solvent. In addition, the concentration of the quantum dots was optically determined through quantitative determination of the absorbance using an ultraviolet-visible spectrophotometer (UV-Vis Spectrophotometer) V-770 manufactured by JASCO Corporation.

Cd-based quantum dots (QDs): green-light emitting quantum dots (hereinafter referred to as G-QDs) and red-light emitting quantum dots (hereinafter referred to as R-QDs) each having a core/shell structure Cd-free quantum dots (QDs): green-light emitting Cd-free quantum dots (G-QDs) and red-light emitting Cd-free quantum dots (R-QDs) each having a core/shell structure

[Extruders]

Extruder for Producing Pellets
Manufacturer: TECHNOVEL CORPORATION
Specifications: A twin-screw extruder with a screw diameter of 25 mm
L/D: 40
Maximum kneading temperature: 400° C.
Film extruder for co-extrusion
Manufacturer: TECHNOVEL CORPORATION
Specifications: A total of three extruders including one twin-screw extruder with a screw diameter of 15 mm and two single-screw extruders each with a screw diameter of 15 mm
L/D: 40
Maximum kneading temperature: 400° C.
Width of T-dies: 200 mm

[Optical Measuring Device]
Spectroradiometer
Manufacturer: TOPCON TECHNOHOUSE CORPORATION, SR3-AR and SR3A

[Optical Measuring Device]
Microscope
Manufacturer: KEYENCE CORPORATION, VHX-5000

Example 1

2 kg of acrylic resin was mixed with 30 mL of a Cd-based G-QD-dispersed hexane solution (the concentration of which was determined from the optical absorbance, and the necessary amount of the solution was calculated from the determined concentration) so that the dispersed solution was applied to the entire pellets. Then, the hexane solution was evaporated to obtain resin pellets with surfaces coated with the QDs.

Then, ZnSt (6.0 g: 0.3 wt %) was added to the resin pellets, and the pellets and the powder were dry-mixed so that the surfaces of the pellets were coated with ZnSt.

The thus obtained pellets were kneaded with a twin-screw extruder at a molding temperature of 200 to 230° C., and the obtained strands were cut with a pelletizer so that acrylic resin pellets containing the QDs dispersed therein were obtained.

The obtained acrylic resin pellets containing the G-QDs were dried in a vacuum drying oven at 60° C. for 24 hours or more, and the resulting pellets were used as an acrylic resin masterbatch containing the Cd-based G-QDs in the next step.

Example 2

2 kg of acrylic resin was mixed with 25 mL of a Cd-based R-QD-dispersed hexane solution so that the dispersed solution was applied to the entire pellets. Then, the hexane solution was evaporated to obtain acrylic resin pellets with surfaces coated with the QDs.

Then, ZnSt (4.0 g: 0.2 wt %) was added to the resin pellets, and the pellets and the powder were dry-mixed so that the surfaces of the pellets were coated with ZnSt.

The thus obtained pellets were kneaded with a twin-screw extruder at a molding temperature of 200 to 230° C., and the obtained strands were cut with a pelletizer so that acrylic resin pellets containing the QDs dispersed therein were obtained.

The obtained acrylic resin pellets containing the R-QDs were dried in a vacuum drying oven at 60° C. for 24 hours or more, and the resulting pellets were used as an acrylic resin masterbatch containing the Cd-based R-QDs in the next step.

Example 3

2 kg of COP was mixed with 30 mL of a Cd-based G-QD-dispersed hexane solution, and the hexane solution was evaporated quickly so that COP resin pellets with surfaces coated with the QDs were obtained.

Then, ZnSt (6.0 g: 0.3 wt %) was added to the resin pellets, and the pellets and the powder were dry-mixed so that the surfaces of the pellets were coated with ZnSt.

The thus obtained pellets were kneaded with a twin-screw extruder at a molding temperature of 200 to 220° C., and the obtained strands were cut with a pelletizer. Thus, COP resin pellets containing the QDs dispersed therein were obtained.

The obtained COP resin pellets containing the G-QDs were dried in a vacuum drying oven at 60° C. for 24 hours or more, and the resulting pellets were used as a COP resin masterbatch containing the Cd-based G-QDs in the next step.

Example 4

2 kg of COP was mixed with 25 mL of a Cd-based R-QD-dispersed hexane solution, and the hexane solution was evaporated quickly so that COP resin pellets with surfaces coated with the QDs were obtained.

Then, ZnSt (4.0 g: 0.2 wt %) was added to the resin pellets, and the pellets and the powder were dry-mixed so that the surfaces of the pellets were coated with ZnSt.

The thus obtained pellets were kneaded with a twin-screw extruder at a molding temperature of 200 to 220° C., and the obtained strands were cut with a pelletizer. Thus, COP resin pellets containing the QDs dispersed therein were obtained.

The obtained COP resin pellets containing the R-QDs were dried in a vacuum drying oven at 60° C. for 24 hours or more, and the resulting pellets were used as a COP resin masterbatch containing the Cd-based R-QDs in the next step.

Example 5

2 kg of PET resin was mixed with 30 mL of Cd-based G-QD-dispersed hexane solution so that PET resin pellets with surfaces coated with the QDs were obtained.

Then, ZnSt (6.0 g: 0.3 wt %) was added to the resin pellets, and the pellets and the powder were dry-mixed so that the surfaces of the pellets were coated with ZnSt.

The thus obtained pellets were kneaded with a twin-screw extruder at a molding temperature of 220 to 230° C., and the obtained strands were cut with a pelletizer. Thus, PET resin pellets containing the QDs dispersed therein were obtained.

The obtained PET resin pellets containing the G-QDs were dried in a vacuum drying oven at 60° C. for 24 hours or more, and the resulting pellets were used as a PET resin masterbatch containing the Cd-based G-QDs in the next step.

Example 6

2 kg of PET resin was mixed with 25 mL of a Cd-based R-QD-dispersed hexane solution so that PET resin pellets with surfaces coated with the QDs were obtained.

Then, ZnSt (4.0 g: 0.2 wt %) was added to the resin pellets, and the pellets and the powder were dry-mixed so that the surfaces of the PET pellets were coated with ZnSt.

The thus obtained pellets were loaded into a raw-material feeding port of a twin-screw extruder so as to be kneaded at a temperature of 220 to 230° C., and the obtained strands were cut with a pelletizer. Thus, PET resin pellets containing the QDs dispersed therein were obtained.

The obtained PET resin pellets containing the R-QDs were dried in a vacuum drying oven, and the resulting pellets were used as a PET resin masterbatch containing the Cd-based R-QDs in the next step.

Example 7

2 kg of acrylic resin was mixed with 40 mL of a Cd-free G-QD-dispersed hexane solution so that the dispersed solution was applied to the entire pellets. Then, the hexane solution was evaporated to obtain resin pellets with surfaces coated with the QDs.

Then, ZnSt (10.0 g: 0.5 wt %) was added to the resin pellets, and the pellets and the powder were dry-mixed so that the surfaces of the pellets were coated with ZnSt.

The thus obtained pellets were kneaded with a twin-screw extruder at a molding temperature of 200 to 230° C., and the obtained strands were cut with a pelletizer. Thus, acrylic resin pellets containing the QDs dispersed therein were obtained.

The obtained acrylic resin pellets containing the G-QDs were dried in a vacuum drying oven at 60° C. for 24 hours or more, and the resulting pellets were used as an acrylic resin masterbatch containing the Cd-free G-QDs in the next step.

Example 8

2 kg of acrylic resin was mixed with 60 mL of a Cd-free R-QD-dispersed hexane solution so that the dispersed solution was applied to the entire pellets. Then, the hexane solution was evaporated to obtain resin pellets with surfaces coated with the QDs.

Then, ZnSt (6.0 g: 0.3 wt %) was added to the resin pellets, and the pellets and the powder were dry-mixed so that the surfaces of the pellets were coated with ZnSt.

The thus obtained pellets were kneaded with a twin-screw extruder at a molding temperature of 200 to 230° C., and the obtained strands were cut with a pelletizer. Thus, acrylic resin pellets containing the QDs dispersed therein were obtained.

The obtained acrylic resin pellets containing the R-QDs were dried in a vacuum drying oven at 60° C. for 24 hours or more, and the resulting pellets were used as an acrylic resin masterbatch containing the Cd-free R-QDs in the next step.

Table 1 below collectively illustrates Example 1 to Example 8. It should be noted that the QD concentration indicated in Table 1 is the value calculated from the correlation between the optically determined absorbance and the weight (wt %) of the QDs determined through thermogravimetric analysis (TGA).

TABLE 1

| Example | Resin | QDs | Additive (wt %) | QD Concentration (wt %) |
| --- | --- | --- | --- | --- |
| 1 | Acrylic | Cd-based G-QDs | ZnSt (0.3) | 0.82 |
| 2 | Acrylic | Cd-based R-QDs | ZnSt (0.2) | 0.40 |
| 3 | COP | Cd-based G-QDs | ZnSt (0.3) | 0.82 |
| 4 | COP | Cd-based R-QDs | ZnSt (0.2) | 0.40 |
| 5 | PET | Cd-based G-QDs | ZnSt (0.3) | 0.82 |
| 6 | PET | Cd-based R-QDs | ZnSt (0.2) | 0.40 |

TABLE 1-continued

| Example | Resin | QDs | Additive (wt %) | QD Concentration (wt %) |
|---|---|---|---|---|
| 7 | Acrylic | Cd-free G-QDs | ZnSt (0.5) | 0.69 |
| 8 | Acrylic | Cd-free R-QDs | ZnSt (0.3) | 0.30 |

Example 9

1 kg of a PET resin pellet raw material was loaded into a raw-material feeding port 1 of a molding machine (a resin layer 1), a mixture of 400 g of the acrylic resin masterbatch containing Cd-based G-QDs produced in Example 1 and 600 g of an acrylic resin raw material was loaded into a raw-material feeding port 2 of the molding machine (a resin layer 2), and 1 kg of a PET resin pellet raw material was loaded into a raw-material feeding port 3 (a resin layer 3).

These materials were extruded through T-dies while being melted with a co-extruder at a molding temperature of 200 to 240° C. so that a film with a three-layer structure was obtained.

A film with a total thickness of 320 µm was molded by controlling the extrusion speed and winding speed. The obtained film was wound up on a roller and was cut into the necessary size. Then, the spectrum of the film was measured with a spectroradiometer.

Example 10

1 kg of a PET resin pellet raw material was loaded into a raw-material feeding port 1 of a molding machine (a resin layer 1), a mixture of 800 g of the acrylic resin masterbatch containing Cd-based R-QDs produced in Example 2 and 200 g of an acrylic resin raw material was loaded into a raw-material feeding port 2 of the molding machine (a resin layer 2), and a PET resin pellet raw material was loaded into a raw-material feeding port 3 (a resin layer 3).

These materials were extruded through T-dies while being melted with a co-extruder at a molding temperature of 200 to 240° C. so that a film with a three-layer structure was obtained.

A film with a total thickness of 350 µm was molded by controlling the extrusion speed and winding speed.

The obtained film was wound up on a roller and was cut into the necessary size. Then, the spectrum of the film was measured with a spectroradiometer.

Example 11

500 g of a PET resin pellet raw material was loaded into a raw-material feeding port 1 of a molding machine (a resin layer 1), a mixture of 250 g of the acrylic resin masterbatch containing Cd-based G-QDs produced in Example 1, 500 g of the acrylic resin masterbatch containing Cd-based R-QDs produced in Example 2, and 250 g of the acrylic resin pellet raw material was loaded into a raw-material feeding port 2 of the molding machine (a resin layer 2), and an acrylic resin pellet raw material was loaded into a raw-material feeding port 3 (a resin layer 3).

These materials were extruded through T-dies while being melted with a co-extruder at a molding temperature of 200 to 240° C. so that a film with a three-layer structure was obtained.

A film with a total thickness of 360 µm was molded by controlling the extrusion speed and winding speed.

The obtained film was wound up on a roller and was cut into the necessary size. Then, the spectrum of the film was measured with a spectroradiometer.

Example 12

500 g of the acrylic resin masterbatch containing Cd-based R-QDs produced in Example 2 was loaded into a raw-material feeding port 1 of a molding machine (a resin layer 1), a mixture of 250 g of the acrylic resin masterbatch containing Cd-based G-QDs produced in Example 1 and 250 g of an acrylic resin pellet raw material was loaded into a raw-material feeding port 2 of the molding machine (a resin layer 2), and 500 g of an acrylic resin pellet raw material was loaded into a raw-material feeding port 3 (a resin layer 3).

These materials were extruded through T-dies while being melted with a co-extruder at a molding temperature of 200 to 240° C. so that a film with a three-layer structure was obtained.

A film with a total thickness of 350 µm was molded by controlling the extrusion speed and winding speed.

The obtained film was wound up on a roller and was cut into the necessary size. Then, the spectrum of the film was measured with a spectroradiometer.

Example 13

1 kg of an acrylic resin pellet raw material was loaded into a raw-material feeding port 1 of a molding machine (a resin layer 1), a total of 1 kg of a pellet mixture including 250 g of the acrylic resin masterbatch containing Cd-based G-QDs produced in Example 1, 500 g of the acrylic resin masterbatch containing Cd-based R-QDs produced in Example 2, and 250 g of an acrylic resin pellet raw material was loaded into a raw-material feeding port 2 of the molding machine (a resin layer 2), and 1 kg of an acrylic resin pellet raw material was loaded into a raw-material feeding port 3 (a resin layer 3).

These materials were extruded through T-dies while being melted with a co-extruder at a molding temperature of 200 to 240° C. so that a film with a three-layer structure was obtained.

A film with a total thickness of 380 µm was molded by controlling the extrusion speed and winding speed.

The obtained film was wound up on a roller and was cut into the necessary size. Then, the spectrum of the film was measured with a spectroradiometer.

Example 14

500 g of the COP resin pellet raw material masterbatch containing Cd-based R-QDs produced in Example 4 was loaded into a raw-material feeding port 1 of a molding machine (a resin layer 1), a mixture of 250 g of the COP resin masterbatch containing G-QDs produced in Example 3 and 250 g of a COP resin pellet raw material was loaded into a raw-material feeding port 2 of the molding machine (a resin layer 2), and 500 g of a COP resin pellet raw material was loaded into a raw-material feeding port 3 (a resin layer 3).

These materials were extruded through T-dies while being melted with a co-extruder at a molding temperature of 200 to 240° C. so that a film with a three-layer structure was obtained.

A film with a total thickness of 320 μm was molded by controlling the extrusion speed and winding speed.

The obtained film was wound up on a roller and was cut into the necessary size. Then, the spectrum of the film was measured with a spectroradiometer.

Example 15

500 g of a PET resin pellet raw material was loaded into a raw-material feeding port 1 of a molding machine (a resin layer 1), a mixture of 250 g of the COP resin masterbatch containing Cd-based R-QDs produced in Example 4 and 250 g of a COP resin pellet raw material was loaded into a raw-material feeding port 2 of the molding machine (a resin layer 2), and 500 g of a PET resin pellet raw material was loaded into a raw-material feeding port 3 (a resin layer 3).

These materials were extruded through T-dies while being melted with a co-extruder at a molding temperature of 200 to 240° C. so that a film with a three-layer structure was obtained.

A film with a total thickness of 360 μm was molded by controlling the extrusion speed and winding speed.

The obtained film was wound up on a roller and was cut into the necessary size. Then, the spectrum of the film was measured with a spectroradiometer.

Example 16

A mixture of 250 g of the PET resin masterbatch containing Cd-based R-QDs produced in Example 6 and 250 g of a PET resin pellet raw material was loaded into a raw-material feeding port 1 of a molding machine (a resin layer 1), a mixture of 250 g of the acrylic resin masterbatch containing Cd-based G-QDs produced in Example 1 and 250 g of an acrylic resin pellet raw material was loaded into a raw-material feeding port 2 of the molding machine (a resin layer 2), and 500 g of a PET resin pellet raw material was loaded into a raw-material feeding port 3 (a resin layer 3).

These materials were extruded through T-dies while being melted with a co-extruder at a molding temperature of 200 to 240° C. so that a film with a three-layer structure was obtained.

A film with a total thickness of 200 μm was molded by controlling the extrusion speed and winding speed.

The obtained film was wound up on a roller and was cut into the necessary size. Then, the spectrum of the film was measured with a spectroradiometer.

Example 17

A mixture of 250 g of the COP resin masterbatch containing Cd-based R-QDs produced in Example 4 and 250 g of a COP resin pellet raw material was loaded into a raw-material feeding port 1 of a molding machine (a resin layer 1), a mixture of 250 g of the COP resin masterbatch containing Cd-based G-QDs produced in Example 3 and 250 g of the COP resin masterbatch containing Cd-based R-QDs produced in Example 4 was loaded into a raw-material feeding port 2 of the molding machine (a resin layer 2), and a mixture of 250 g of the COP resin masterbatch containing Cd-based G-QDs produced in Example 3 and 250 g of a COP resin pellet raw material was loaded into a raw-material feeding port 3 (a resin layer 3).

These materials were extruded through T-dies while being melted with a co-extruder at a molding temperature of 200 to 240° C. so that a film with a three-layer structure was obtained.

A film with a thickness of 140 μm was molded by controlling the extrusion speed and winding speed.

The obtained film was wound up on a roller and was cut into the necessary size. Then, the spectrum of the film was measured with a spectroradiometer.

Example 18

500 g of the acrylic resin masterbatch containing Cd-free R-QDs produced in Example 8 was loaded into a raw-material feeding port 1 of a molding machine (a resin layer 1), a mixture of 250 g of the acrylic resin masterbatch containing Cd-free G-QDs produced in Example 7 and 250 g of an acrylic resin pellet raw material was loaded into a raw-material feeding port 2 of the molding machine (a resin layer 2), and 500 g of a PET resin pellet raw material was loaded into a raw-material feeding port 3 (a resin layer 3).

These materials were extruded through T-dies while being melted with a co-extruder at a molding temperature of 200 to 240° C. so that a film with a three-layer structure was obtained.

A film with a total thickness of 240 μm was molded by controlling the extrusion speed and winding speed.

The obtained film was wound up on a roller and was cut into the necessary size. Then, the spectrum of the film was measured with a spectroradiometer.

Example 19

A mixture of 250 g of the acrylic resin masterbatch containing Cd-free R-QDs produced in Example 8 and 250 g of an acrylic resin pellet raw material was loaded into a raw-material feeding port 1 of a molding machine (a resin layer 1), a mixture of 250 g of the acrylic resin masterbatch containing Cd-based G-QDs produced in Example 1 and 250 g of an acrylic resin pellet raw material was loaded into a raw-material feeding port 2 of the molding machine (a resin layer 2), and 500 g of an acrylic resin pellet raw material was loaded into a raw-material feeding port 3 (a resin layer 3).

These materials were extruded through T-dies while being melted with a co-extruder at a molding temperature of 200 to 240° C. so that a film with a three-layer structure was obtained.

A film with a total thickness of 220 μm was molded by controlling the extrusion speed and winding speed.

The obtained film was wound up on a roller and was cut into the necessary size. Then, the spectrum of the film was measured with a spectroradiometer.

Table 2 collectively illustrates Example 9 to Example 19. It should be noted that the QD concentration indicated in Table 2 is the value calculated from the correlation between the optically determined absorbance and the weight (wt %) of the QDs determined through thermogravimetric analysis (TGA). The total thickness indicated in Table 2 is the actual measurement value measured with a micrometer.

TABLE 2

Figure 11:
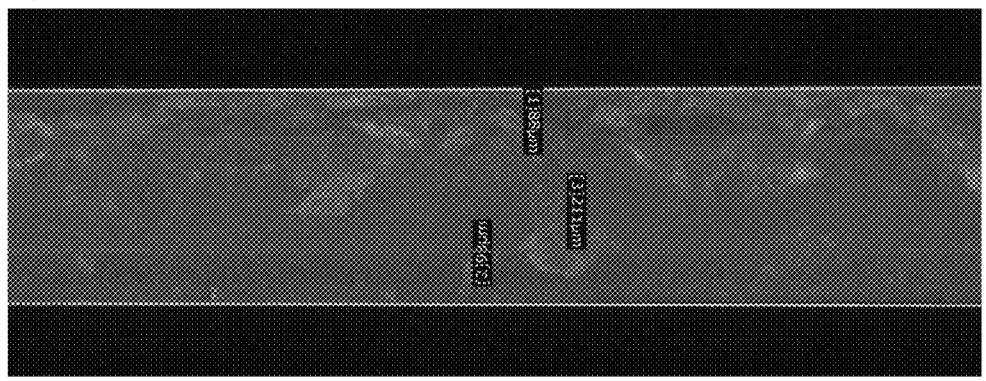
FIG. 11 is an enlarged photograph of a cross-sectional view a quantum dot-containing resin film according to Example 13.
Figure 12:
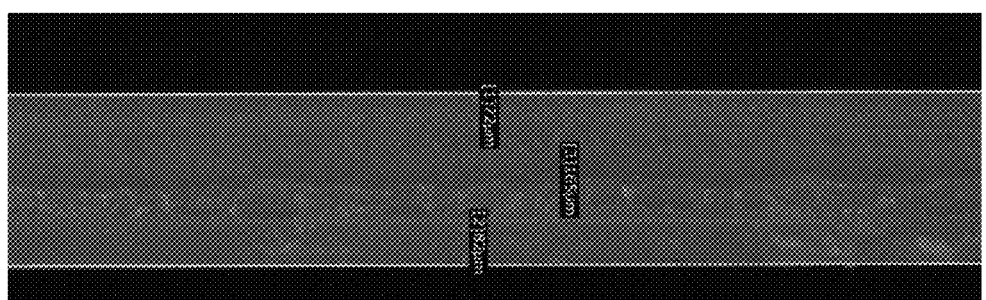
FIG. 12 is an enlarged photograph of a cross-sectional view of a quantum dot-containing resin film according to Example 14.
Figure 13:
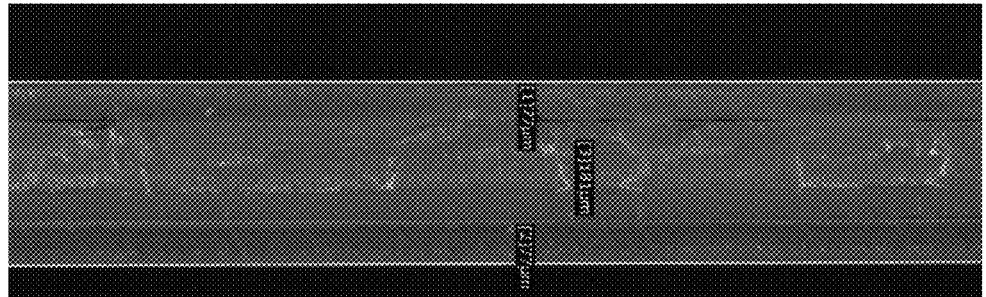
FIG. 13 is an enlarged photograph of a cross-sectional view of a quantum dot-containing resin film according to Example 15.
Figure 14:
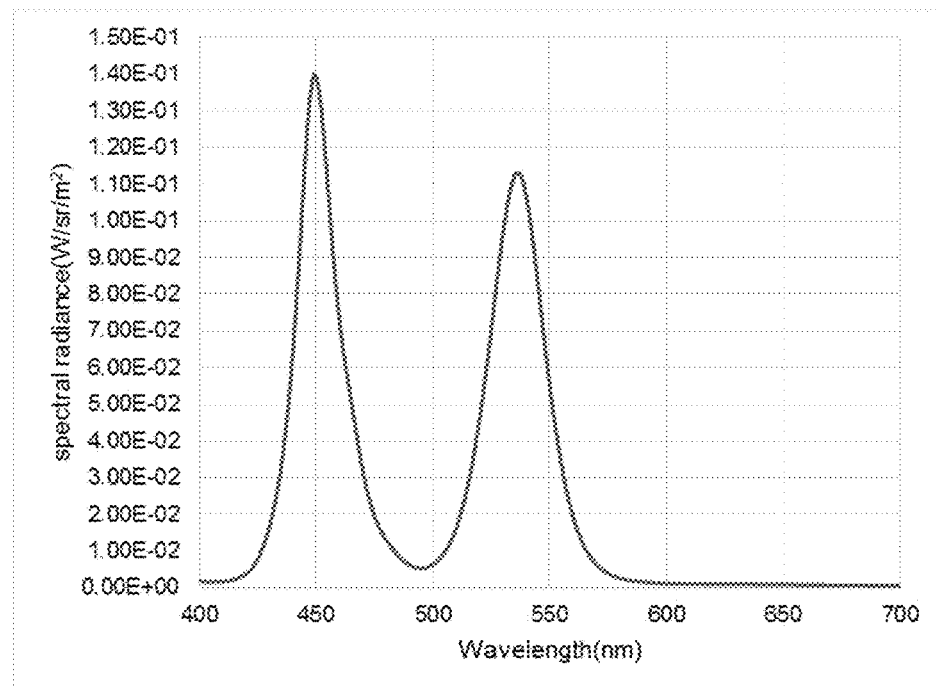
FIG. 14 illustrates the spectrum of the quantum dot-containing resin film according to Example 9.
Figure 15:
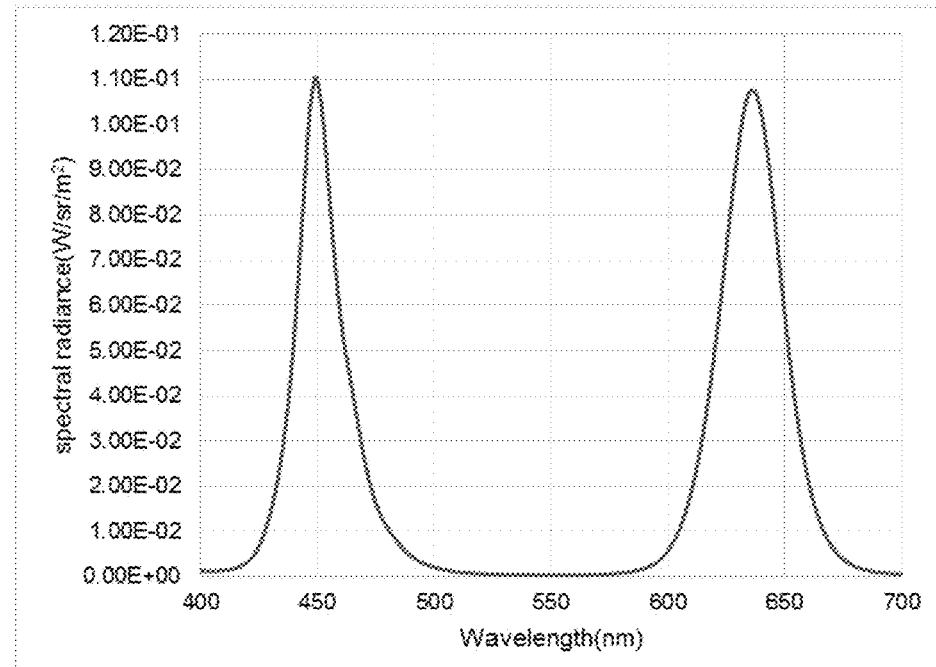
FIG. 15 illustrates the spectrum of the quantum dot-containing resin film according to Example 10.
Figure 16:
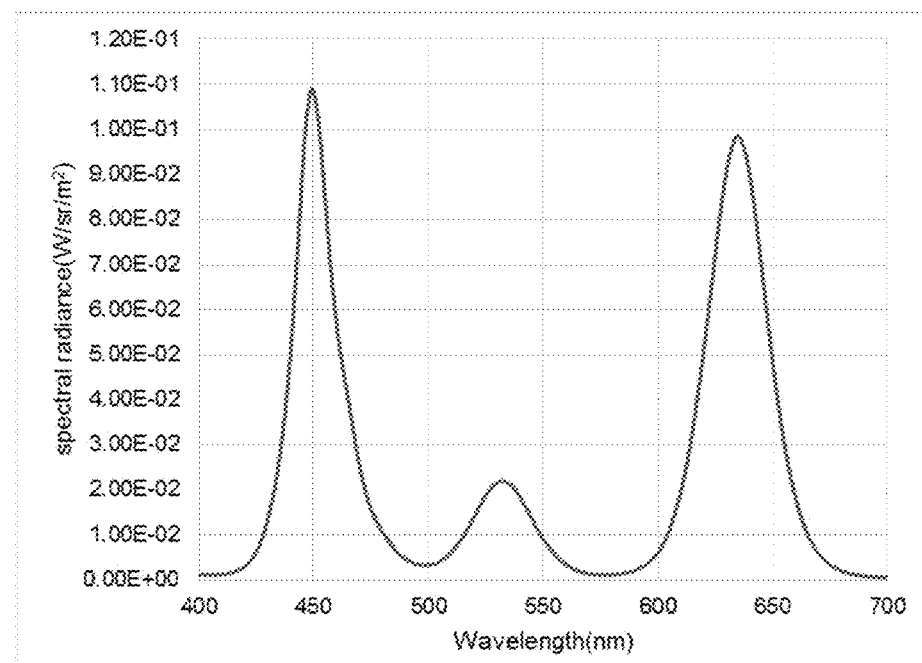
FIG. 16 illustrates the spectrum of the quantum dot-containing resin film according to Example 11.
Figure 17:
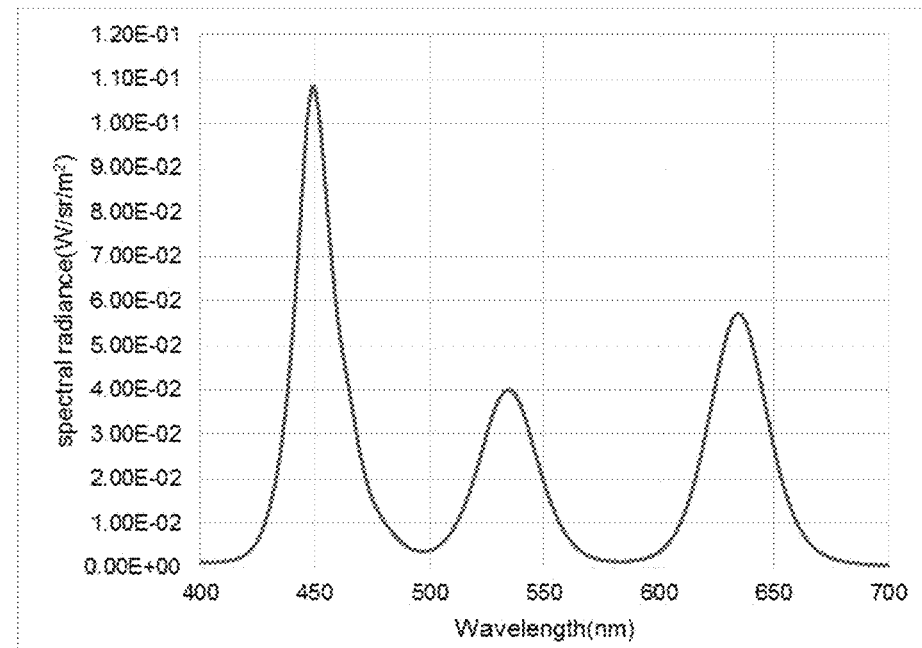
FIG. 17 illustrates the spectrum of the quantum dot-containing resin film according to Example 12.
Figure 18:
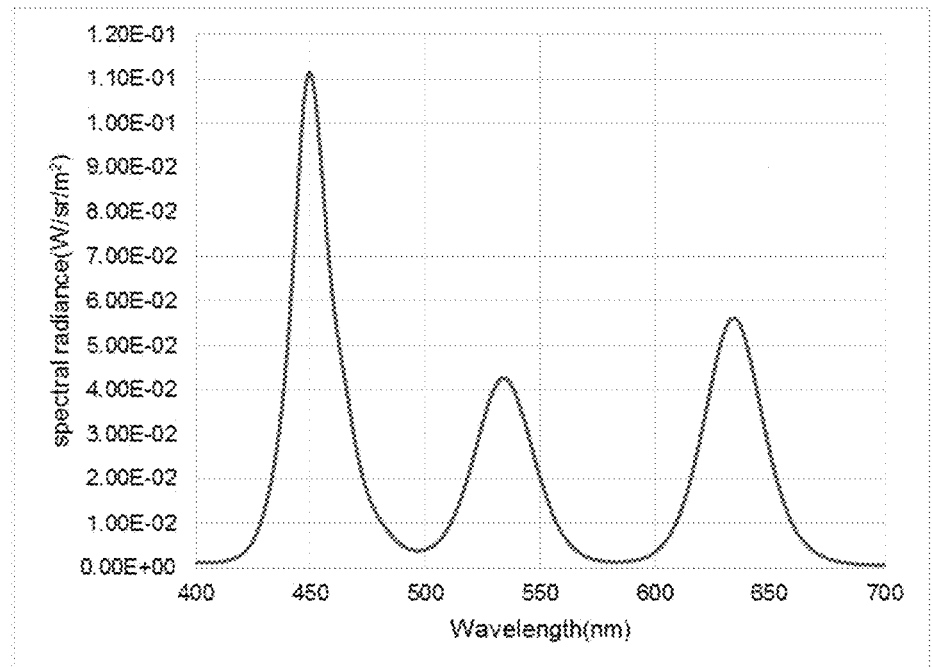
FIG. 18 illustrates the spectrum of the quantum dot-containing resin film according to Example 12 (measured by turning the film of Example 12, which has been measured as illustrated in FIG. 17, upside down).
Figure 19:
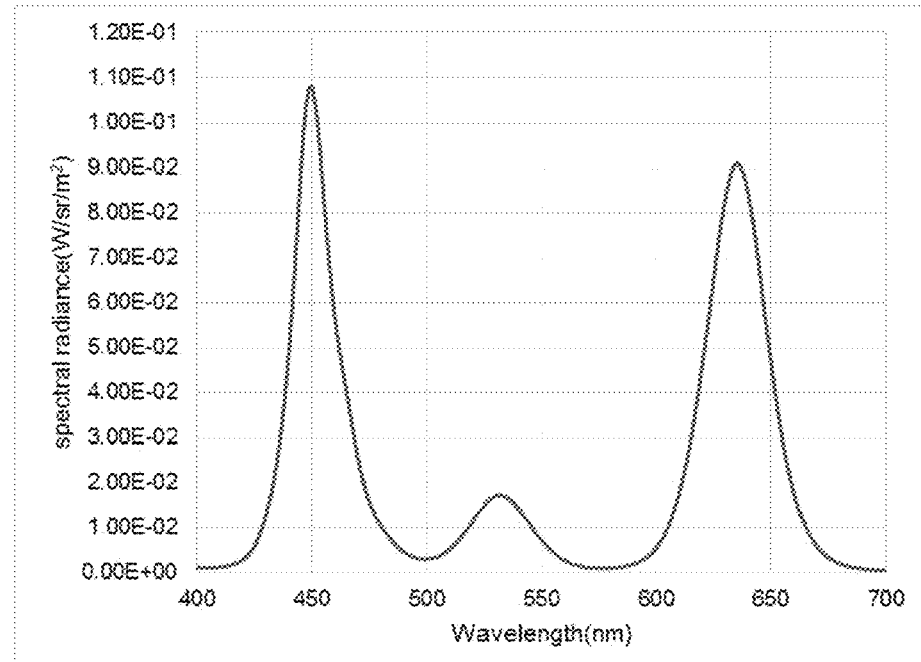
FIG. 19 illustrates the spectrum of the quantum dot-containing resin film according to Example 13.
Figure 20:
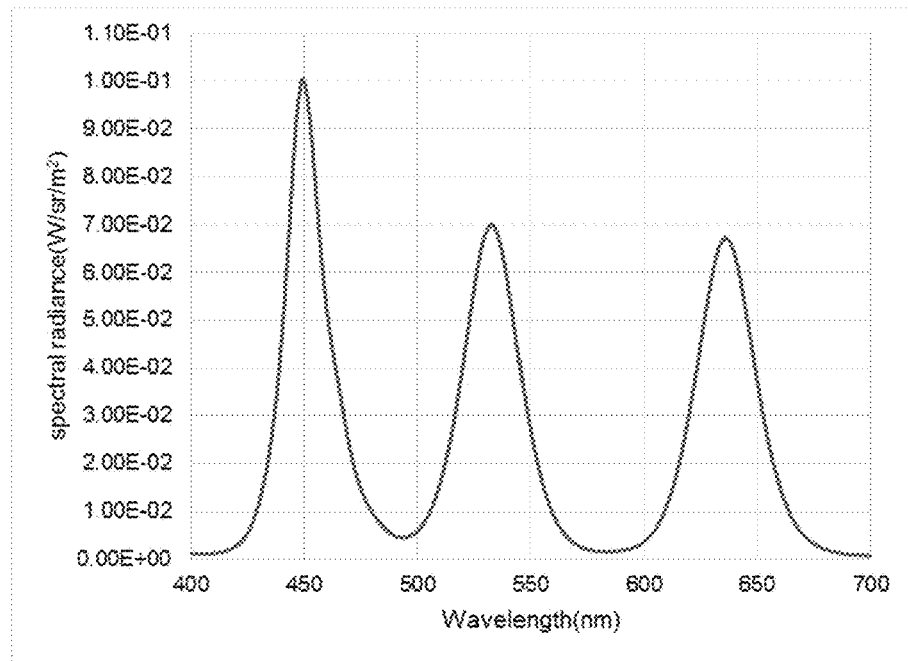
FIG. 20 illustrates the spectrum of the quantum dot-containing resin film according to Example 14.
Figure 21:
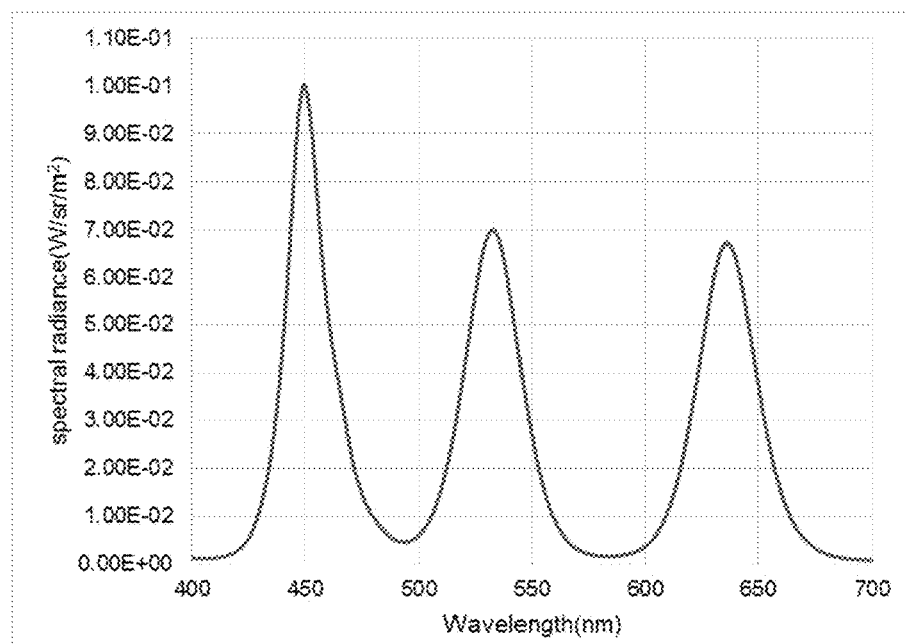
FIG. 21 illustrates the spectrum of the quantum dot-containing resin film according to Example 14.
Figure 22:
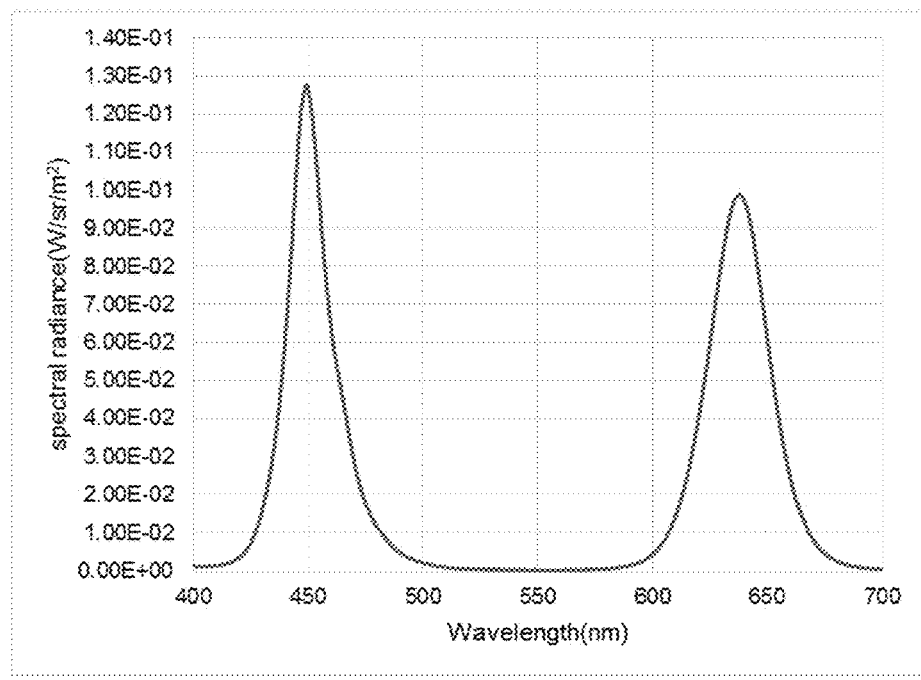
FIG. 22 illustrates the spectrum of the quantum dot-containing resin film according to Example 15.
Figure 23:
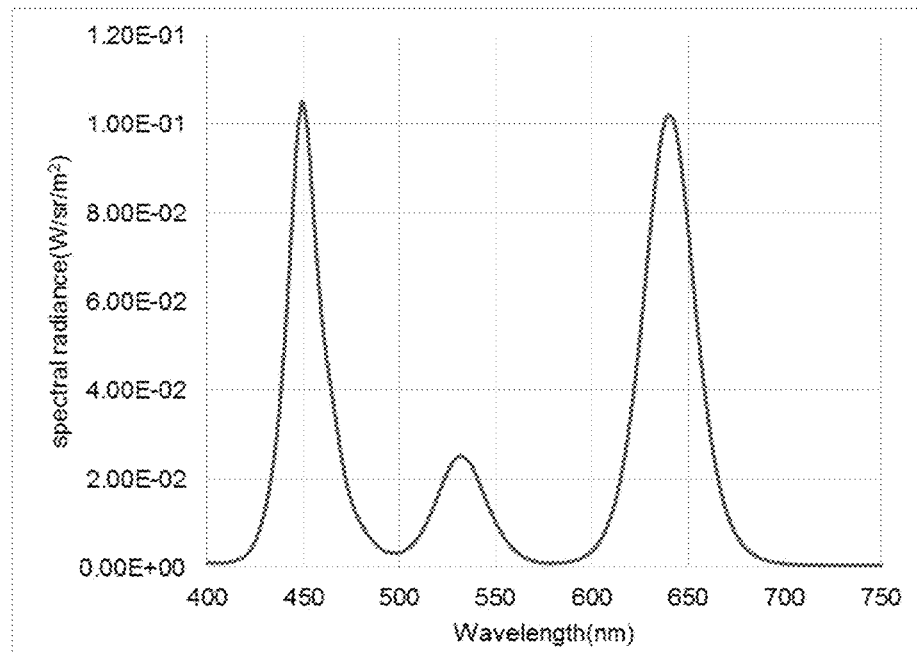
FIG. 23 illustrates the spectrum of a quantum dot-containing resin film according to Example 16.
Figure 24:
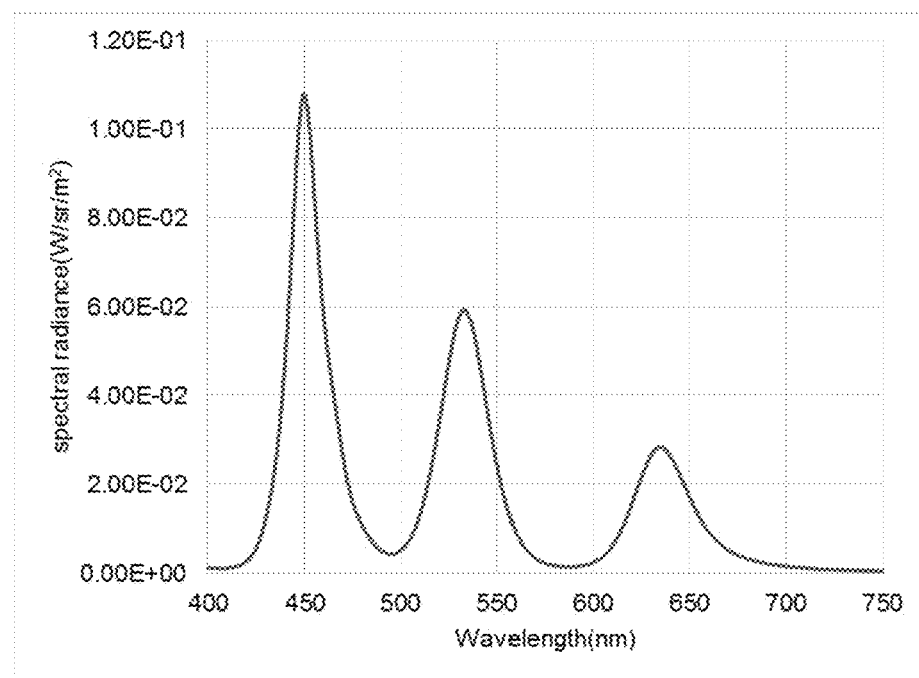
FIG. 24 illustrates the spectrum of a quantum dot-containing resin film according to Example 17.
Figure 25:
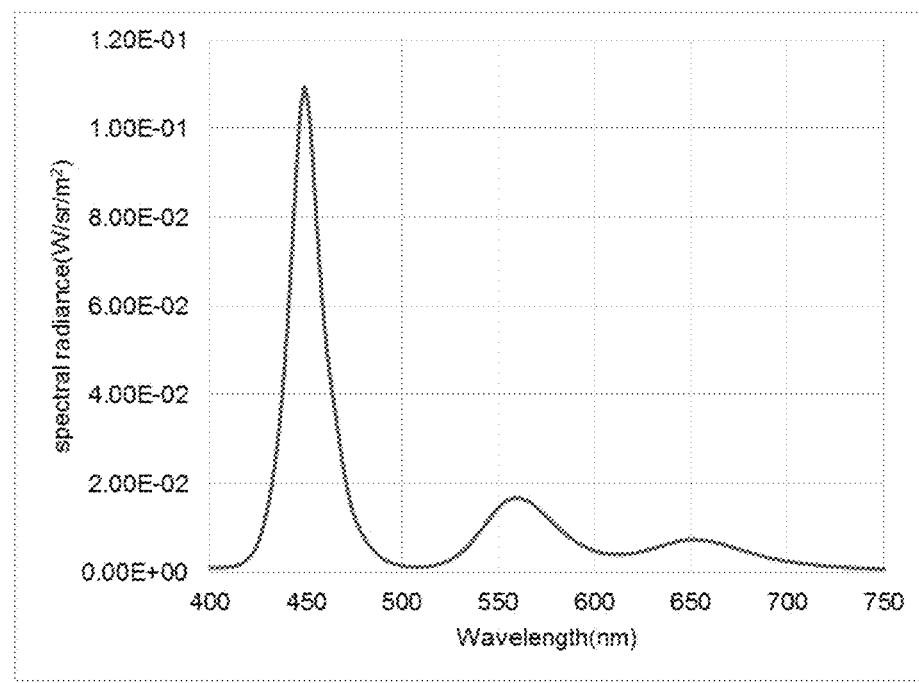
FIG. 25 illustrates the spectrum of a quantum dot-containing resin film according to Example 18.
Figure 26:
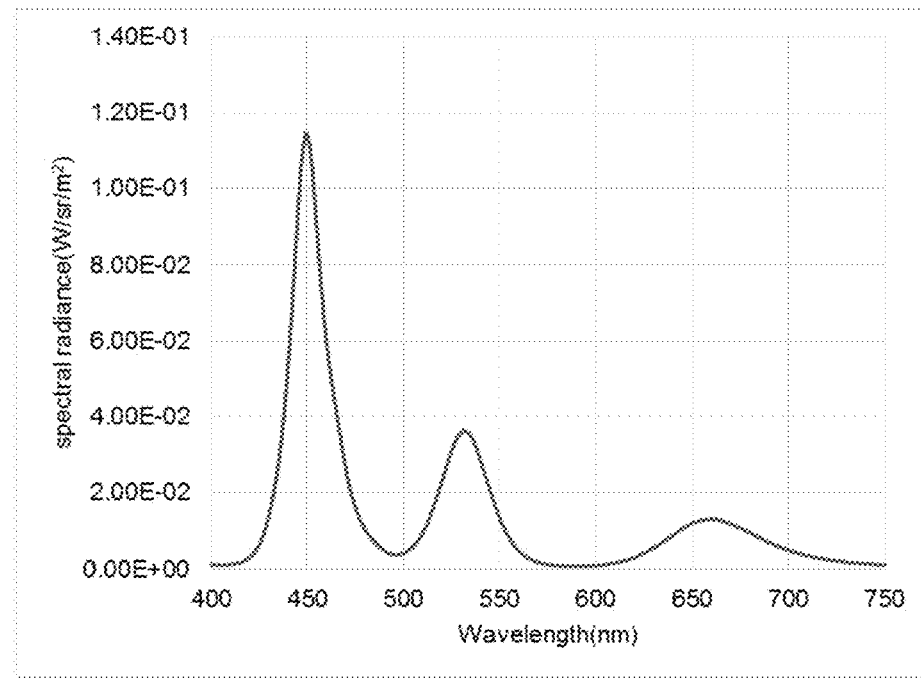
FIG. 26 illustrates the spectrum of a quantum dot-containing resin film according to Example 19.

| Example | Resin Layer 1 QD (Concentration: wt %) | Resin Layer 2 QD (Concentration: wt %) | Resin Layer 3 QD (Concentration: wt %) | Total Thickness (μm) | FIG. No. Cross-Section Photograph Spectrum |
|---|---|---|---|---|---|
| 9 | PET | Acrylic Cd-based G-QDs (0.332) | PET | 320 | FIG. 7 FIG. 14 |
| 10 | PET | Acrylic Cd-based R-QDs (0.16) | PET | 350 | FIG. 8 FIG. 15 |
| 11 | PET | Acrylic Cd-based G-QDs (0.21) Cd-based R-QDs (0.10) | Acrylic | 360 | FIG. 9 FIG. 16 |
| 12 | Acrylic Cd-based R-QDs (0.20) | Acrylic Cd-based G-QDs (0.41) | Acrylic | 350 | FIG. 10 FIGS. 17 and 18 |
| 13 | Acrylic | Acrylic Cd-based G-QDs (0.21) Cd-based R-QDs (0.10) | Acrylic | 380 | FIG. 11 FIG. 19 |
| 14 | COP Cd-based R-QDs (0.20) | COP Cd-based G-QDs (0.42) | COP | 320 | FIG. 12 FIGS. 20 and 21 |
| 15 | PET | COP Cd-based R-QD (0.20) | PET | 360 | FIG. 13 FIG. 22 |
| 16 | PET Cd-based R-QDs (0.20) | Acrylic Cd-based G-QDs (0.41) | PET | 200 | N/A FIG. 23 |
| 17 | COP Cd-based R-QDs (0.20) | COP Cd-based G-QDs (0.41) Cd-based R-QDs (0.20) | COP Cd-based G-QDs (0.41) | 140 | N/A FIG. 24 |
| 18 | Acrylic Cd-free R-QDs (0.30) | Acrylic Cd-free G-QDs (0.69) | PET | 240 | N/A FIG. 25 |
| 19 | Acrylic Cd-free R-QDs (0.15) | Acrylic Cd-based G-QDs (0.42) | Acrylic | 220 | N/A FIG. 26 |

The results of observation of the enlarged cross-section of each of the films in FIG. 7 to FIG. 13 verified that each film is actually made up of three layers and has a structure in which target quantum dots (QDs) are uniformly dispersed.

In addition, each of the three-layer films of Example 9 to Example 19 except Example 15 has an integrated structure and even when the film was crushed into fine pieces, the resulting fragments of the film had no peeling of the front layer. Regarding the film of Example 15, interlayer peeling occurred when force was applied to the film. This is considered to be because PET resin and COP resin have low compatibility.

FIG. 14 to FIG. 26 illustrate RGB spectra obtained when the quantum dot-containing resin films were lit with back light. Measurement was conducted with SR3-A of TOPCON TECHNOHOUSE CORPORATION. It should be noted that measurement was also conducted using a brightness enhancement film (BEF) manufactured by 3M Company.

FIG. 14, FIG. 15, and FIG. 22 respectively illustrate the spectra of films that include middle layers containing single-color Cd-based QDs, that is, Cd-based G-QDs (Example 9), Cd-based R-QDs (Example 10), and Cd-based R-QDs (Example 15). A peak resulting from conversion of excitation light (450 nm) into green or red light by the corresponding QDs was observed. This could confirm that QDs were surely contained in each film and the wavelength of the excitation light was converted.

FIG. 16, FIG. 17, FIG. 19, and FIG. 20 respectively illustrate the spectra of the films of Example 11, Example 12, Example 13, and Example 14. Each film contains both G-QDs and R-QDs in a single layer or in separate layers within the film. It was confirmed from peaks in each graph that excitation light was converted into both green light and red light by a single film.

Each of the films of Example 11 and Example 13 includes a middle layer containing both G-QDs and R-QDs dispersed therein, and the concentration of each of the G-QDs and R-QDs was adjusted so that the absorbance of excitation light by each of the G-QDs and R-QDs became equal. In this manner, G-QDs and R-QDs are ideally designed so that they have equal peak intensity. However, in FIG. 16 and FIG. 19, the fluorescence peak intensity of red light is significantly higher than that of green light. This is because the R-QDs absorb the fluorescence of the G-QDs, and therefore, the fluorescence intensity of green light significantly decreases, and the fluorescence intensity of red light increases correspondingly. This results in significantly decreased brightness of the entire film. This is the problem with the decrease in light conversion efficiency that occurs when a QD film is used as described above.

Meanwhile, each of the films of Example 12 and Example 14 contains G-QDs and R-QDs in different layers. In FIG. 17 and FIG. 20, the peak intensity of green fluorescence and that of red fluorescence peak are close. That is, it was verified that dispersing G-QDs and R-QDs in different layers can improve the aforementioned problem to a significant degree.

FIG. 18 and FIG. 21 respectively illustrate the spectra of the films of Example 12 and Example 14 measured by turning the films upside down. That is, FIG. 17 and FIG. 18 each illustrate the spectrum of the film of Example 12, and the spectrum in FIG. 18 was measured by turning the film of Example 12 illustrated in FIG. 17 upside down. In addition, FIG. 20 and FIG. 21 each illustrate the spectrum of the film of Example 14, and the spectrum in FIG. 21 was measured by turning the film of Example 14 illustrated in FIG. 20 upside down.

When measurement is conducted with the film of Example 12 turned upside down, the ratio between the green fluorescence intensity and the red fluorescence intensity becomes different. That is, there is no difference in spectrum between when the layer containing R-QDs is located above the layer containing G-QDs (FIG. 17) and when the layer containing G-QDs is located above the layer containing R-QDs (FIG. 18), and the RGB ratio remained the same.

Similarly, regarding the film of Example 14, no difference in optical properties was observed when the positions of the front layer and the back layer were reversed, though the layer structure of the film is asymmetrical (FIG. 20 and FIG. 21).

This is considered to be because the measurement was conducted with a brightness enhancement film (BEF). When measurement is conducted with a BEF placed on the target film, light is repeatedly reflected within the film, that is, light passes both in the direction from bottom to top and in the direction from top to bottom while being absorbed, scattered, and wavelength-converted. For this reason, it is considered that the asymmetry of the film structure was not exhibited as optical properties.

Figure 27:
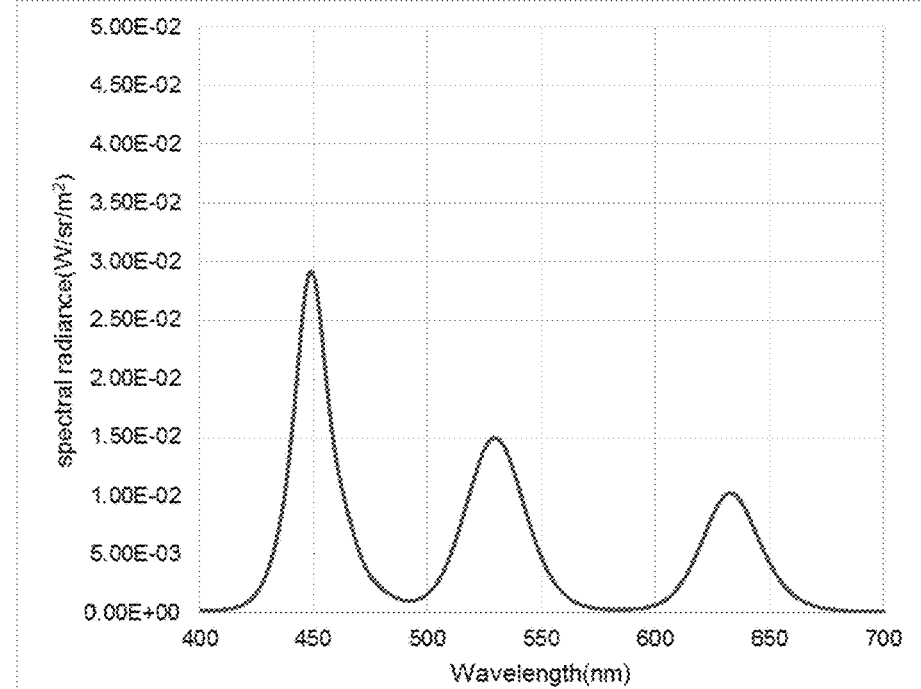
FIG. 27 illustrates the spectrum of the quantum dot-containing resin film according to Example 12 (measured without a BEF).
Figure 28:
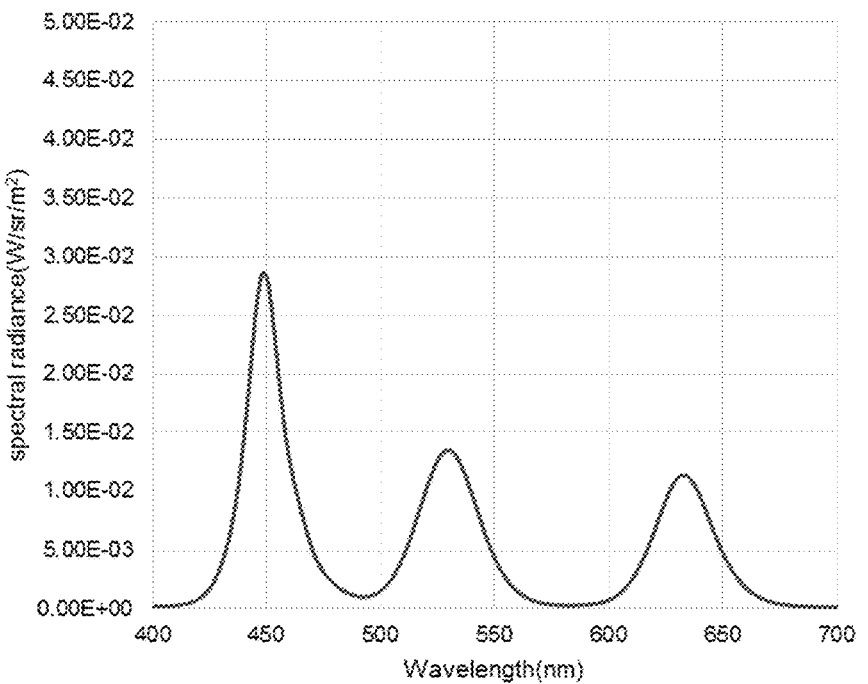
FIG. 28 illustrates the spectrum of the quantum dot-containing resin film according to Example 12 (measured without a BEF; measured by turning the film of Example 12, which has been measured as illustrated in FIG. 27, upside down).

To confirm the influence of asymmetry of a film structure on optical properties, the film produced in Example 12 was measured in a similar manner without a BEF. Then, it was verified from the spectra in FIG. 27 and FIG. 28 that the G/R ratios are actually different and the optical properties of the film differ depending on the arrangement of the front and back layers.

Figure 29:
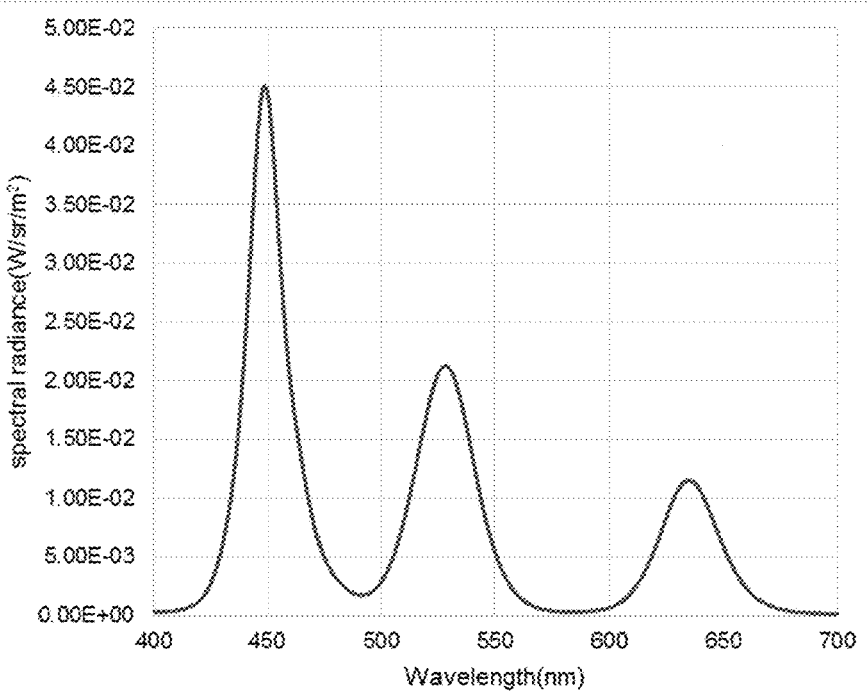
FIG. 29 illustrates the spectrum of the quantum dot-containing resin film according to Example 14 (measured without a BEF).
Figure 30:
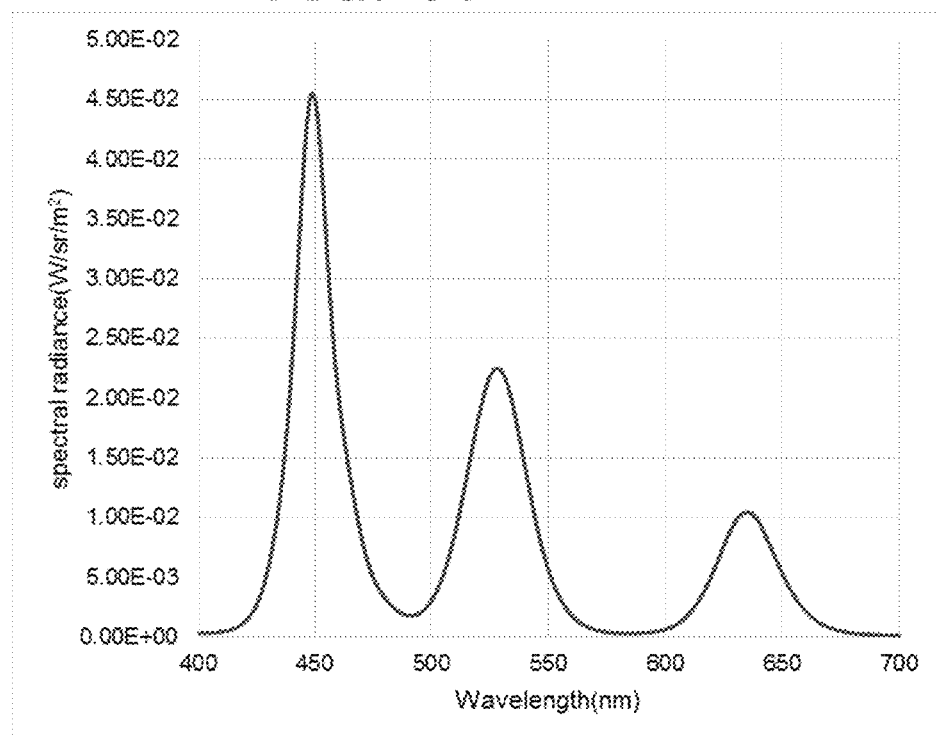
FIG. 30 illustrates the spectrum of the quantum dot-containing resin film according to Example 14 (measured without a BEF; measured by turning the film of Example 14, which has been measured as illustrated in FIG. 29, upside down).

Such a difference due to the difference in arrangement of the front and back layers was also confirmed for the film produced in Example 14 (FIG. 29 and FIG. 30). This is considered to be due to both the influence that the QDs arranged on the side of excitation light convert light first, and the influence that the R-QDs absorb not only the excitation light but also green fluorescence and convert it into red light.

FIG. 23 illustrates the spectrum of the film of Example 16. The film is designed such that the concentration of the R-QDs increases in a region from the lower layer to the upper layer.

FIG. 25 illustrates the spectrum of the film with a three-layer structure produced in Example 18 that contains Cd-free G-QDs and Cd-free R-QDs. It was verified from the spectrum that the film surely included green fluorescence and red fluorescence.

FIG. 26 illustrates the spectrum of a hybrid QD film with a three-layer structure produced in Example 19 that includes a middle layer containing Cd-based G-QDs and an outer layer containing Cd-free R-QDs. It was verified from the spectrum that the film surely included green fluorescence resulting from conversion by the Cd-based G-QDs and red fluorescence.

INDUSTRIAL APPLICABILITY

According to the present invention, a resin sheet or film containing quantum dots with excellent light conversion efficiency can be advantageously used as a wavelength conversion member.

The present application is based on Japanese Patent Application No. 2017-200602 filed on Oct. 16, 2017, which is incorporated herein by reference in its entirety.

The invention claimed is:

1. A quantum dot-containing resin sheet or film comprising a stack of a plurality of resin layers, at least one of the resin layers containing quantum dots,
   wherein the plurality of resin layers is integrally molded through co-extrusion, and
   wherein a concentration of the quantum dots in the entire resin layers is greater than or equal to 0.05% and less than or equal to 1.5%.

2. The quantum dot-containing resin sheet or film according to claim 1, wherein a resin layer containing the quantum dots and a resin layer not containing the quantum dots are integrally molded.

3. The quantum dot-containing resin sheet or film according to claim 2, wherein the resin layer not containing the quantum dots contains a functional additive.

4. The quantum dot-containing resin sheet or film according to claim 1, wherein two or more types of quantum dots with different fluorescence wavelengths are contained in different resin layers among the plurality of resin layers.

5. The quantum dot-containing resin sheet or film according to claim 4, wherein the quantum dots include at least green-light emitting quantum dots and red-light emitting quantum dots.

6. The quantum dot-containing resin sheet or film according to claim 5, comprising:
   a first resin layer containing the green-light emitting quantum dots and not containing the red-light emitting quantum dots;
   a second resin layer containing the red-light emitting quantum dots and not containing the green-light emitting quantum dots; and
   a middle resin layer located between the first resin layer and the second resin layer and containing both the red-light emitting quantum dots and the green-light emitting quantum dots,
   wherein the green-light emitting quantum dots and the red-light emitting quantum dots each have a concentration gradient in a region from the first resin layer to the second resin layer.

7. The quantum dot-containing resin sheet or film according to claim 5,
   wherein the resin layer containing the red-light emitting quantum dots is arranged on a side of excitation light, and the resin layer containing the green-light emitting quantum dots is arranged on a side remote from the excitation light.

8. The quantum dot-containing resin sheet or film according to claim 1, wherein each of the plurality of resin layers contains amorphous resin.

9. A quantum dot-containing resin sheet or film comprising resin layers containing two or more types of quantum dots with different fluorescence wavelengths, each of the two or more types of quantum dots having a different concentration gradient in a thickness direction of the resin layers.

10. The quantum dot-containing resin sheet or film according to claim 1, wherein a total thickness of the resin layers is greater than or equal to 50 μm and less than or equal to 500 μm.

11. The quantum dot-containing resin sheet or film according to claim 1, wherein each of a ratio of a peak green light intensity of the quantum dot-containing resin sheet or film to a peak blue light intensity of the quantum dot-containing resin sheet or film and a ratio of a peak red light intensity of the quantum dot-containing resin sheet or film to the peak blue light intensity of the quantum dot-containing resin sheet or film is greater than or equal to 0.3.

12. The quantum dot-containing resin sheet or film according to claim 1, wherein a full width at half maximum of fluorescence of each of a blue light intensity of the quantum dot-containing resin sheet or film, a green light intensity of the quantum dot-containing resin sheet or film, and a red light intensity of the quantum dot-containing resin sheet or film is less than or equal to 100 nm.

13. A wavelength conversion member that is formed from the quantum dot-containing resin sheet or film according to claim 1.

14. The quantum dot-containing resin sheet or film according to claim 1, wherein the at least one of the resin layers, which contains the quantum dots, contains amorphous resin.

* * * * *